(12) United States Patent
Wu et al.

(10) Patent No.: US 12,469,817 B2
(45) Date of Patent: Nov. 11, 2025

(54) SUPPORT STRUCTURE TO REINFORCE STACKED SEMICONDUCTOR WAFERS

(71) Applicant: Taiwan Semiconductor Manufacturing Company, Ltd., Hsinchu (TW)

(72) Inventors: Kuo-Ming Wu, Zhubei (TW); Hau-Yi Hsiao, Chiayi (TW); Ping-Tzu Chen, Tainan (TW); Chung-Jen Huang, Tainan (TW); Sheng-Chau Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 547 days.

(21) Appl. No.: 17/888,569

(22) Filed: Aug. 16, 2022

(65) Prior Publication Data

US 2023/0352438 A1 Nov. 2, 2023

Related U.S. Application Data

(60) Provisional application No. 63/335,362, filed on Apr. 27, 2022.

(51) Int. Cl.
*H01L 21/00* (2006.01)
*H01L 23/00* (2006.01)

(52) U.S. Cl.
CPC ............ *H01L 24/80* (2013.01); *H01L 23/562* (2013.01); *H01L 24/08* (2013.01);
(Continued)

(58) Field of Classification Search
CPC ............... H01L 21/6836; H01L 21/304; H01L 2224/08145; H01L 2224/16145; H01L 23/3107; H01L 21/02013; H01L 2224/81894; H01L 2224/83203; H01L 24/86; H01L 21/682; H01L 25/0756; H01L 2224/24145; H01L 2224/81201; H01L 24/80; H01L 23/562; H01L 24/08; H01L 2224/80007; H01L 2224/80895; H01L 2224/80896; H01L 2924/3512; H01L 2924/35121
See application file for complete search history.

(56) References Cited

U.S. PATENT DOCUMENTS 8,119,500 B2 * 2/2012 Yang ................... H01L 21/2007
438/455
10,734,285 B2 * 8/2020 Li .......................... H01L 24/94
(Continued)

*Primary Examiner* — Niki H Nguyen
(74) *Attorney, Agent, or Firm* — Eschweiler & Potashnik, LLC

(57) ABSTRACT

Various embodiments of the present disclosure are directed towards a method for forming a semiconductor structure. The method includes bonding a first semiconductor wafer to a second semiconductor wafer. A bond interface is disposed between the first and second semiconductor wafers. The first semiconductor wafer has a peripheral region laterally surrounding a central region. A support structure is formed between a first outer edge of the first semiconductor wafer and a second outer edge of the second semiconductor wafer. The support structure is disposed within the peripheral region. A thinning process is performed on the second semiconductor wafer.

20 Claims, 17 Drawing Sheets

(52) U.S. Cl.
CPC ............... *H01L 2224/08145* (2013.01); *H01L 2224/80007* (2013.01); *H01L 2224/80895* (2013.01); *H01L 2224/80896* (2013.01); *H01L 2924/3512* (2013.01); *H01L 2924/35121* (2013.01)

(56) References Cited

U.S. PATENT DOCUMENTS

| | | |
|---|---|---|
| 10,741,504 B2 | 8/2020 | Yoshida |
| 2008/0268614 A1 | 10/2008 | Yang et al. |
| 2020/0006145 A1 | 1/2020 | Li et al. |
| 2021/0035926 A1 | 2/2021 | Liu et al. |

\* cited by examiner

SUPPORT STRUCTURE TO REINFORCE STACKED SEMICONDUCTOR WAFERS

REFERENCE TO RELATED APPLICATION

This Application claims the benefit of U.S. Provisional Application No. 63/335,362, filed on Apr. 27, 2022, the contents of which are incorporated by reference in their entirety.

BACKGROUND

Many modern electronic devices use integrated chips that are formed on semiconductor wafers during semiconductor device fabrication processes. Increasingly, semiconductor wafers may be stacked and bonded together to form multi-dimensional integrated chips. Multi-dimensional integrated chips have a number of advantages over traditional two-dimensional integrated chips, such as higher device density, greater speed, and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
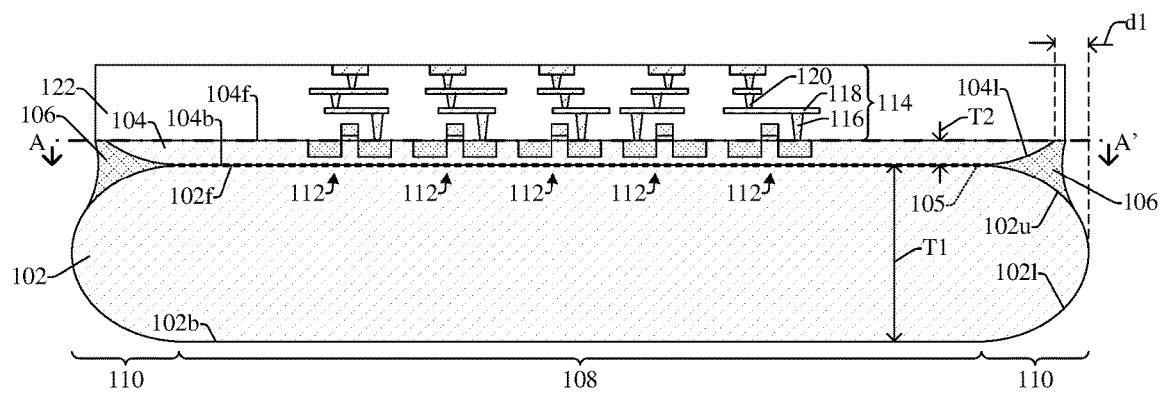
FIG. 1A illustrates a cross-sectional view of some embodiments of a bonded wafer structure comprising a first semiconductor wafer bonded to a second semiconductor wafer and a support structure disposed in a peripheral region of the first semiconductor wafer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

A multi-dimensional integrated chip comprises a plurality of integrated chip structures stacked onto one another. A method for manufacturing a multi-dimensional integrated chip includes a wafer stacking method that includes bonding a first wafer to a second wafer. In such a method, semiconductor devices (e.g., transistors) may be formed on a first wafer and/or a second wafer. Interconnect structures may be formed over the first wafer and/or the second wafer. The interconnect structures respectively comprise metallization layers (e.g., comprising conductive contacts, conductive wires, conductive vias, etc.) disposed within a dielectric structure (e.g., comprising a plurality of dielectric layers stacked over one another). The first wafer and second wafer are bonded together at a bonding interface to form a multi-dimensional integrated chip. After bonding the first and second wafers together, a thinning process is performed on the second wafer to reduce a thickness of the second wafer. In addition, a trimming process may be performed on the multi-dimensional integrated chip to remove materials over a peripheral region of the first wafer. The trimming process cuts into portions of the interconnect structures and/or wafers. A trim wall is defined by sidewalls of the interconnect structures and/or sidewalls of the wafers that are exposed by the trimming process.

It has been appreciated that trimming and/or thinning the multi-dimensional integrated chip may result in damage to the dielectric structure and/or wafers during the trimming process, thinning process, and/or during subsequent processing steps (e.g., planarization, etching, etc.). For example, before or after the bonding process the first and/or second wafers generally have a rounded outer edge when viewed in cross section. This results in a non-bond region between a peripheral region of the first wafer and a peripheral region of the second wafer. During the thinning process pressure is applied across a back surface of the second wafer. The second wafer may be damaged (e.g., crack, peel, etc.) as the pressure is applied due to the lack of structural support in the peripheral region of the second wafer.

The trimming process may be performed on the peripheral regions of the first and/or second wafers after the bonding process to remove the rounded outer edges. During the trimming process a blade is used to remove materials from the peripheral regions of the first and/or second wafers, however, the blade may push against sidewalls of the interconnect structures (e.g., along sidewalls of the dielectric structure) and/or sidewalls of the first and second wafers that were exposed by the trimming (e.g., rub against the trim wall). The force from the blade may damage the interconnect structures and/or first and second wafers and cause peeling, cracking, or the like at sidewalls of the interconnect structures and/or sidewalls of the first and second wafers. Accordingly, damage from the thinning process and/or trimming process may render semiconductor dies along a perimeter of the multi-dimensional integrated chip unreliable or inoperable, thereby decreasing a yield of the multi-dimensional integrated chip.

Further, as additional wafers are stacked on the multi-dimensional integrated chip to increase the device density over the first wafer a lateral area for the semiconductors devices is decreased. For example, the trimming process is performed after each wafer is bonded to the first wafer and reduces a width of a central region of the multi-dimensional integrated chip. As more wafers are stacked the width of the central region continues to decreases, thereby decreasing a lateral area for the semiconductor devices to be disposed. This may decrease a device density of the multi-dimensional integrated chip.

Various embodiments of the present application are directed towards an integrated chip having a support structure disposed between peripheral regions of bonded wafers to prevent damage during fabrication (e.g., during a thinning process). In some embodiments, the integrated chip comprises a first semiconductor structure bonded to a second semiconductor structure. The first and second semiconductor structures may each comprise semiconductor devices disposed on a wafer and an interconnect structure disposed on the semiconductor devices. The interconnect structure comprises a plurality of metallization layers disposed within a dielectric structure. The wafers of the first and second semiconductor structures have a rounded outer edge when viewed in cross section that is disposed in a peripheral region of the wafers. A support structure is disposed vertically between the rounded outer edges of the wafers and provides structural support for the bonded first and second semiconductor structures. By including the support structure, damage (e.g., peeling, cracking, etc.) during a thinning process on the wafer of the second semiconductor structure is reduced. In addition, since the support structure reduces damage in the peripheral region of the wafers the trimming process may be omitted, thereby decreasing damage to the first and second semiconductor structures, decreasing fabrication costs/time, and increasing a lateral area for semiconductor devices disposed on the wafers. Thus, a reliability, yield, and device density of the integrated chip is increased.

FIG. 1A illustrates a cross-sectional view 100a of some embodiments of a bonded wafer structure comprising a first semiconductor wafer 102 bonded to a second semiconductor wafer 104 and a support structure 106 disposed in a peripheral region 110 of the first semiconductor wafer 102.

The first semiconductor wafer 102 has a central region 108 that is laterally surrounded by a peripheral region 110. A front-side surface 102f of the first semiconductor wafer 102 is opposite a back-side surface 102b of the first semiconductor wafer 102. The second semiconductor wafer 104 overlies the first semiconductor wafer 102 and has a back-side surface 104b that contacts the front-side surface 102f of the first semiconductor wafer 102 along a bond interface 105. The first semiconductor wafer 102 has a first thickness T1 and the second semiconductor wafer 104 has a second thickness T2. In some embodiments, the second thickness T2 is less than the first thickness T1.

A plurality of semiconductor devices 112 is disposed on and/or within a front-side surface 104f of the second semiconductor wafer 104. The semiconductor devices 112 are disposed laterally within the central region 108 of the first semiconductor wafer 102. In various embodiments, the semiconductor devices 112 are configured as transistors and each comprise a gate dielectric (not labeled), a gate electrode (not labeled) over the gate dielectric, and a pair of source/drain regions (not labeled) disposed on opposing sides of the gate electrode. An interconnect structure 114 overlies the plurality of semiconductor devices 112 and comprises metallization layers disposed within a dielectric structure 122. The metallization layers of the interconnect structure 114 comprise a plurality of conductive contacts 116, a plurality of conductive wires 118, and a plurality of conductive vias 120. The metallization layers are configured to provide electrical connections to the plurality of semiconductor devices 112.

The first and second semiconductor wafers 102, 104 have a rounded profile, a bullet-shaped profile, or the like in the peripheral region 110 when viewed in cross section. In some embodiments, the first semiconductor wafer 102 has an upper rounded edge 102u in the peripheral region 110 and a lower rounded edge 102l below the upper rounded edge 102u, and the second semiconductor wafer 104 has a lower rounded edge 104l below a substantially flat top surface of the second semiconductor wafer 104. The substantially flat top surface of the second semiconductor wafer 104 may be defined by the front-side surface 104f of the second semiconductor wafer 104.

A support structure 106 is disposed in the peripheral region 110 and continuously extends from the lower rounded edge 104l of the second semiconductor wafer 104 to the upper rounded edge 102u of the first semiconductor wafer 102. The support structure 106 provides structural support in the peripheral region 110 and mitigates damage to the first semiconductor wafer 102 during fabrication (e.g., during a thinning process) of the bonded wafer structure. In some embodiments, during fabrication of the bonded wafer structure, the back-side surface 104b of the second semiconductor wafer 104 is bonded to the front-side surface 102f of the first semiconductor wafer 102, thereby forming the bond interface 105 between the first and second semiconductor wafers 102, 104. Subsequently, a thinning process is performed on the second semiconductor wafer 104 to reduce an initial thickness of the second semiconductor wafer 104 to the second thickness T2. However, after the bonding process non-bond areas are present between the first and second semiconductor wafers 102, 104. Non-bond areas occur because areas of the first semiconductor wafer 102 and areas of the second semiconductor wafer 104 do not bond together during the bonding process (e.g., due to surfaces of the first and/or second semiconductor wafers 102, 104 not being substantially planar). For example, non-bond areas exist in the peripheral region 110 due to shapes of the upper rounded edge 102u of the first semiconductor wafer 102 and the lower rounded edge 104l of the second semiconductor wafer 104.

Including the support structure 106 reduces and/or fills at least a portion of the non-bond areas, thereby improving structural support between the first and second semiconductor wafers 102, 104. The improved structural support reduces damage (e.g., due to unwanted mechanical stress) during the thinning process and/or during subsequent processing steps (e.g., processing steps utilized to form the semiconductor devices 112 and the interconnect structure 114) performed on the bonded wafer structure. Accordingly, the support structure 106 may increase a reliability and yield of the bonded wafer structure. In addition, since the support structure 106 reduces damage in the peripheral region 110 a trimming process may be omitted, thereby further decreasing damage to the first and second semiconductor wafers 102, 104, decreasing fabrication costs/time, and increasing a lateral area for the semiconductor devices 112 disposed in the central region 108. Thus, a reliability and yield of the bonded wafer structure is further increased and a device density of the bonded wafer structure is increased.

In various embodiments, the first and second semiconductor wafers 102, 104 may be any type of semiconductor body (e.g., silicon, monocrystalline silicon, silicon germanium, etc.), one or more die on a wafer, any other type of semiconductor and/or epitaxial layers, or the like. In further embodiments, the first and second semiconductor wafers 102, 104 may each be referred to as a substrate, a semiconductor substrate, etc. In some embodiments, the first thickness T1 of the first semiconductor wafer 102 is about 775 micrometers (um), within a range of about 760 um to about 790 um, or another suitable value. In further embodiments, the second thickness T2 of the second semiconductor wafer 104 is about 3.2 um, within a range of about 3 um to about 3.4 um, or some other suitable value.

In yet further embodiments, the first semiconductor wafer 102 and the second semiconductor wafer 104 are 300 millimeter (mm) wafers each having a radius of 150 mm, where non-bond areas occur on the outermost 2 mm of the first and second semiconductor wafers 102, 104 due to the rounded outer edges or occur somewhere between the outermost 2 mm or the outermost 4 mm. In various embodiments, the support structure 106 is disposed in the outermost 2 mm or the outermost 4 mm of the first and/or second semiconductor wafers 102, 104. For example, the support structure 106 may continuously extend from a first point of the first semiconductor wafer 102 to a second point of the first semiconductor wafer 102, where the first point is located at a position about 148 mm from a center of the first semiconductor wafer 102 and the second point is located at a position about 149.8 mm from the center of the first semiconductor wafer 102. In further embodiments, the support structure 106 is laterally offset from and/or does not exist along the outermost 0.1 mm, the outermost 0.15 mm, or the outermost 0.2 mm of the first semiconductor wafer 102. In yet further embodiments, the support structure 106 continuously extends over the outermost 1.5 mm, the outermost 2 mm, or the outermost 3 mm of the first semiconductor wafer 102. In some embodiments, due to the thinning process a radius of the second semiconductor wafer 104 is less than a radius of the first semiconductor wafer 102. In various embodiments, an outer edge of the second semiconductor wafer 104 is laterally offset from an outer edge of the first semiconductor wafer 102 by a distance d1. The distance d1 may, for example, be about 0.25 mm, within a range of about 0.2 mm to 0.3 mm, or some other suitable value.

In some embodiments, the plurality of semiconductor devices 112 may for example, each be or comprise a metal oxide semiconductor field effect transistor (MOSFET), a high voltage transistor, a bipolar junction transistor (BJT), an n-channel metal oxide semiconductor (nMOS) transistor, a p-channel metal oxide semiconductor (pMOS) transistor, a gate-all-around FET (GAAFET), a gate-surrounding FET, a multi-bridge channel FET (MBCFET), a nanowire FET, a nanoring FET, a nanosheet field-effect transistor (NSFET), or the like. It will be appreciated that the plurality of semiconductor devices 112 each being configured as another semiconductor device is also within the scope of the disclosure. In further embodiments, the dielectric structure 122 may comprise a stack of dielectric layers. The stack of dielectric layers may, for example, comprise one or more of silicon dioxide, doped silicon dioxide (e.g., carbon doped silicon dioxide), silicon oxynitride, borosilicate glass (BSG), phosphoric silicate glass (PSG), some other low-k dielectric, silicon nitride, silicon carbide, or some other suitable material. In various embodiments, the metallization layers (e.g., conductive contacts 116, conductive wires 118, and/or conductive vias 120) of the interconnect structure 114 may, for example, comprise copper, aluminum, ruthenium, titanium, tantalum, tungsten, some other suitable material, or any combination of the foregoing. In yet further embodiments, the support structure 106 may, for example, be or comprise an oxide (e.g., silicon dioxide), silicon nitride, silicon, amorphous silicon, tungsten, copper, some other suitable material, or any combination of the foregoing. In some embodiments, the support structure 106 is a dielectric and may comprise silicon dioxide, silicon nitride, or the like. In further embodiments, the support structure 106 is conductive and may comprise tungsten, copper, some other conductive material, or any combination of the foregoing. In further embodiments, the support structure 106 may, for example, be or comprise epoxy, a polymer, silicon, some other suitable material, or any combination of the foregoing. In some embodiments, the first semiconductor wafer 102 is configured as or referred to as a carrier substrate and/or the second semiconductor wafer 104 is configured as or referred to as a semiconductor substrate or a device substrate.

Figure 1B:
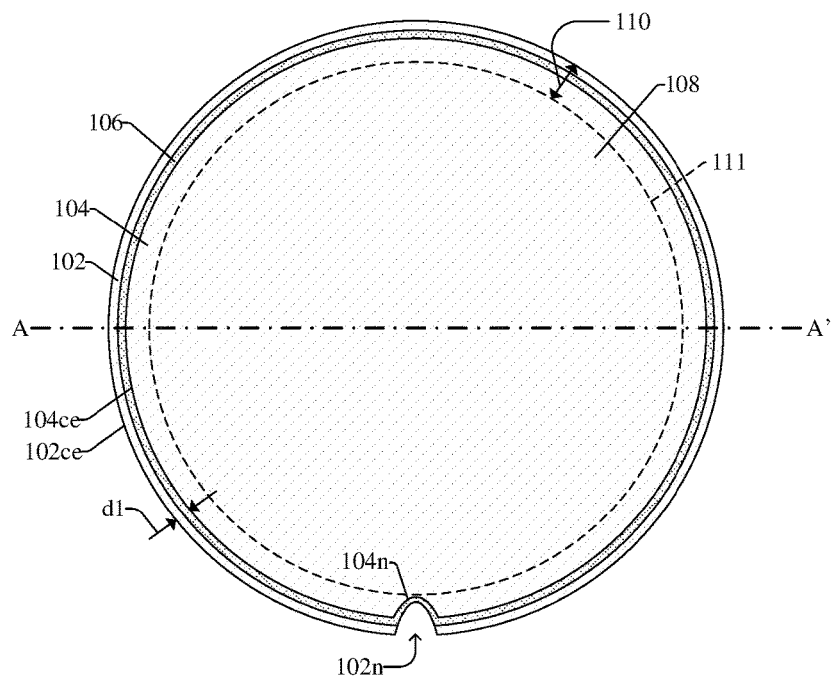
FIG. 1B illustrates a top view of some embodiments of the bonded wafer structure of FIG. 1A.

FIG. 1B illustrates a top view 100b of some embodiments of the bonded wafer structure of FIG. 1A taken along the line A-A'. For ease of illustration features (e.g., source/drain regions) of the semiconductor devices (112 of FIG. 1A) are omitted from the top view 100b of FIG. 1B.

The central region 108 of the first semiconductor wafer 102 is laterally surrounded by the peripheral region 110. Further, a circumferential edge 102ce of the first semiconductor wafer 102 and a circumferential edge 104ce of the second semiconductor wafer 104 are each circular but for the presence of notches 102n, 104n. The notches 102n, 104n are disposed along the circumferential edges 102ce, 104ce and each extend inwardly towards centers of the first and second semiconductor wafers 102, 104. Further, an outer perimeter of the central region 108 is defined by a device region edge 111, where the semiconductor devices (112 of FIG. 1A) are spaced laterally within the device region edge 111. In some embodiments, the support structure 106 continuously extends from outside the circumferential edge 104ce of the second semiconductor wafer 104 to the device region edge 111. In further embodiments, the support structure 106 continuously extends from outside the circumferential edge 104ce of the second semiconductor wafer 104 into the central region 108 (i.e., extending through the device region edge 111). In various embodiments, the support structure 106 is ring-shaped. Further, the support structure 106 may conform to a shape of the notches 102n, 104n of the first and second semiconductor wafers 102, 104.

Figure 2A:
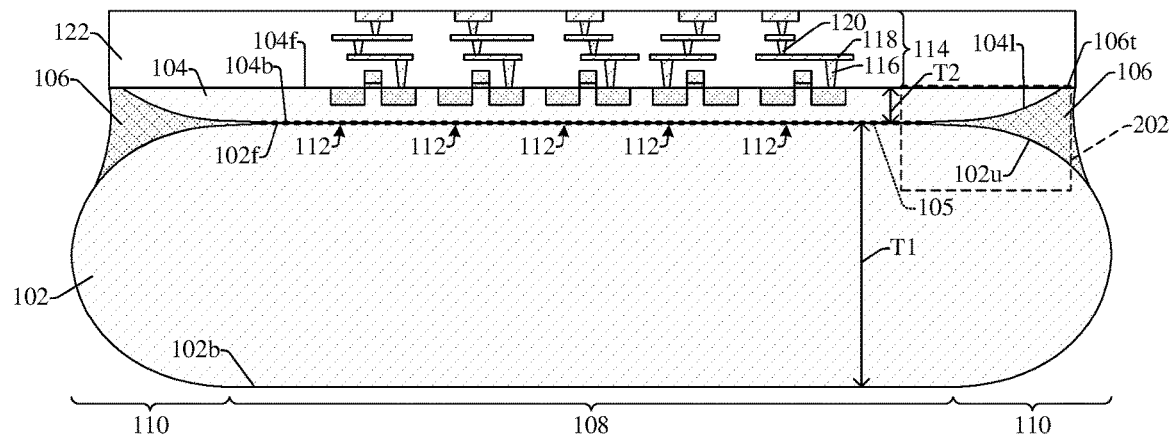
FIG. 2A illustrates a cross-sectional view of some other embodiments of the bonded wafer structure of FIG. 1A.

FIG. 2A illustrates a cross-sectional view 200a of some other embodiments of the bonded wafer structure of FIG. 1A, where the support structure 106 extends into the central region 108 of the first semiconductor wafer 102.

In various embodiments, the support structure 106 continuously extends from the upper rounded edge 102u of the first semiconductor wafer 102 to directly contact the bond interface 105 between the first and second semiconductor wafers 102, 104. In some embodiments, a width of the support structure 106 is greater than a height of the support structure 106. Further, an outer surface of the support structure 106 is concave and curves inward towards a center of the first semiconductor wafer 102, and the outer edge of the first semiconductor wafer 102 is convex and curves outward away from the center of the first semiconductor wafer 102. In various embodiments, a top surface 106t of the support structure 106 is aligned with the front-side surface 104f of the second semiconductor wafer 104. In further embodiments, an upper surface of the support structure 106 is curved and conforms to a shape of the lower rounded edge 104l of the second semiconductor wafer 104 and a lower surface of the support structure 106 is curved and conforms to a shape of the upper rounded edge 102u of the first semiconductor wafer 102. In various embodiments, the height of the support structure 106 continuously decreases from the outer edge of the second semiconductor wafer 104 in a direction towards the bond interface 105. In yet further embodiments, a maximum height of the support structure 106 is greater than the second thickens T2 of the second semiconductor wafer 104.

Figure 2B:
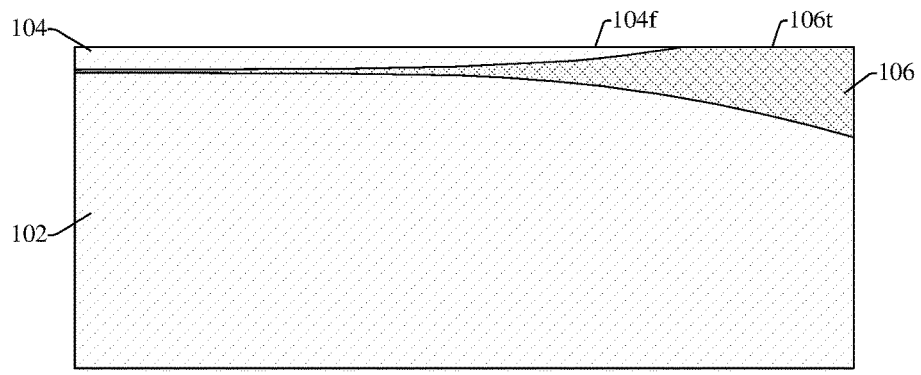
FIGS. 2B-2C illustrate cross-sectional views of various embodiments of close-up views of a section of the bonded wafer structure of FIG. 2A.

FIG. 2B illustrates a cross-sectional view of some embodiments of a region of the bonded wafer structure of FIG. 2A, as indicated by the dashed box 202 of FIG. 2A. As illustrated in FIG. 2B, the support structure 106 is disposed directly between the first semiconductor wafer 102 and the second semiconductor wafer 104. Further, the top surface 106t of the support structure 106 and the front-side surface 104f of the second semiconductor wafer 104 are both substantially flat and co-planar with one another.

Figure 2C:
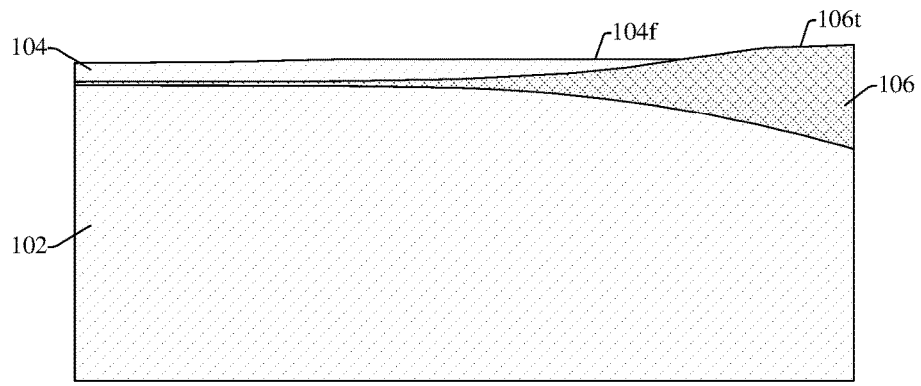

FIG. 2C illustrates a cross-sectional view of a different embodiment of a region of the bonded wafer structure of FIG. 2A, as indicated by the dashed box 202 of FIG. 2A, where the top surface 106t of the support structure 106 is vertically above the front-side surface 104f of the second semiconductor wafer 104.

Figure 3A:
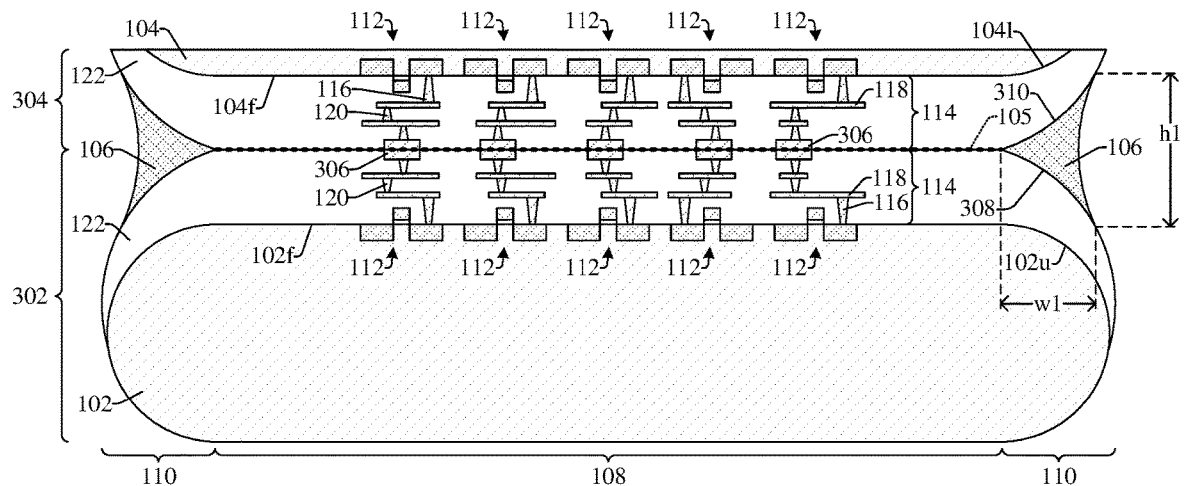
FIGS. 3A-3C illustrate cross-sectional views of some embodiments of a multi-dimensional integrated chip comprising a support structure disposed between a first semiconductor structure and a second semiconductor structure.

FIG. 3A illustrates a cross-sectional view 300a of some embodiments of a multi-dimensional integrated chip comprising a support structure 106 disposed between a first semiconductor structure 302 and a second semiconductor structure 304.

The first semiconductor structure 302 comprises a first semiconductor wafer 102 and the second semiconductor structure 304 comprises a second semiconductor wafer 104. In some embodiments, the first and second semiconductor wafers 102, 104 are configured as the first and second semiconductor wafers of FIGS. 1A and 1B such that the first and second semiconductor wafers 102, 104 respectively comprise a notch. Further, the first and second semiconductor structures 302, 304 respectively comprise a plurality of semiconductor devices 112 disposed on a corresponding one of the first and second semiconductor wafers 102, 104. Further, the first and second semiconductor structures 302, 304 comprise an interconnect structure 114 disposed within a dielectric structure 122 over the semiconductor devices 112. The interconnect structure 114 comprises a plurality of metallization layers that include a plurality of conductive contacts 116, a plurality of conductive wires 118, a plurality of conductive vias 120, and a plurality of conductive bonding structures 306. The conductive bonding structures 306 may, for example, comprise copper, aluminum, tungsten, gold, some other conductive material, or any combination of the foregoing.

The first semiconductor structure 302 meets the second semiconductor structure 304 at a bond interface 105. In various embodiments, the bond interface 105 comprises dielectric-to-dielectric bonds between the dielectric structures 122 of the first and second semiconductor structures 302, 304 and conductor-to-conductor bonds between the conductive bonding structures 306 of the first and second semiconductor structures 302, 304. In various embodiments, the dielectric structure 122 of the first semiconductor structure 302 has a first curved surface 308 that conforms to a shape of the upper rounded edge 102u of the first semiconductor wafer 102, and the dielectric structure 122 of the second semiconductor structure 304 has a second curved surface 310 that conforms to a shape of the lower rounded edge 104l of the second semiconductor wafer 104. A support structure 106 is disposed in an outer region between the first semiconductor structure 302 and the second semiconductor structure 304. The support structure 106 continuously extends from the first curved surface 308 to the second curved surface 310. Further, the support structure 106 fills non-bond areas between the first and second semiconductor structures 302, 304, thereby improving a structural integrity of the multi-dimensional integrated chip.

The improved structural support reduces damage (e.g., due to unwanted mechanical stress) during a thinning process and/or during subsequent processing steps (e.g., subsequent bonding process(es) and/or thinning process(es)) performed on the multi-dimensional integrated chip. Accordingly, the support structure 106 may increase a reliability and yield of the multi-dimensional integrated chip. In addition, since the support structure 106 reduces damage in the peripheral region 110 a trimming process may be omitted, thereby further decreasing damage to the first and second semiconductor structures 302, 304, decreasing fabrication costs/time, and increasing a lateral area for the semiconductor devices 112 disposed in the central region 108. Thus, a reliability and yield of the multi-dimensional integrated chip is further increased and a device density of the multi-dimensional integrated chip is increased. In various embodiments, a height hl of the support structure 106 is greater than a width w1 of the support structure 106. In some embodiments, the height hl is within a range of about 0.1 mm to about 0.65 mm, or some other suitable value.

Figure 3B:
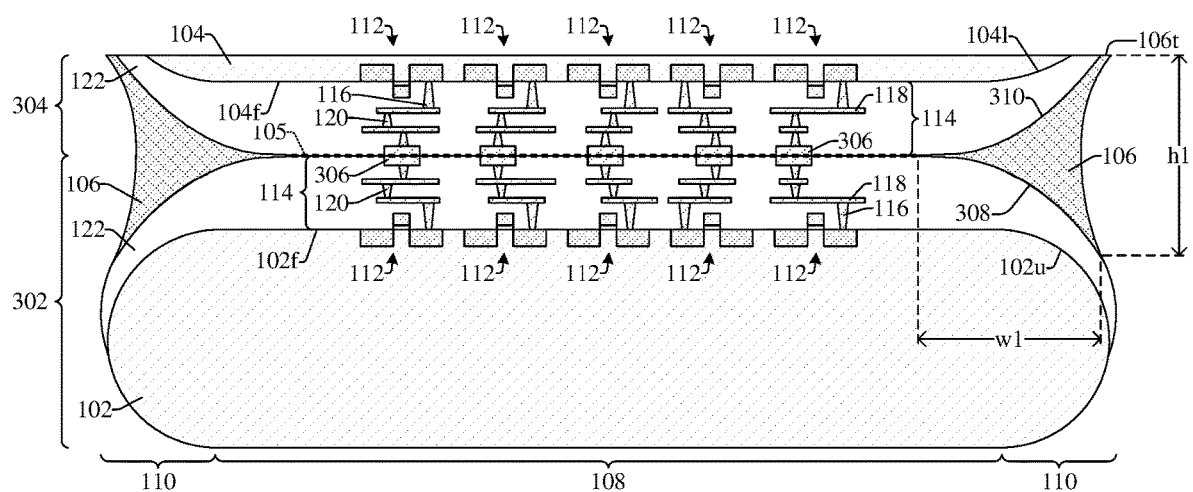

FIG. 3B illustrates a cross-sectional view 300b of some other embodiments of the multi-dimensional integrated chip of FIG. 3A, where a top surface 106t of the support structure 106 is aligned with a top surface of the dielectric structure 122 of the second semiconductor structure 304 and a top surface of the second semiconductor wafer 104. In various embodiments, the width w1 of the support structure 106 is greater than the height hl of the support structure 106.

Figure 3C:
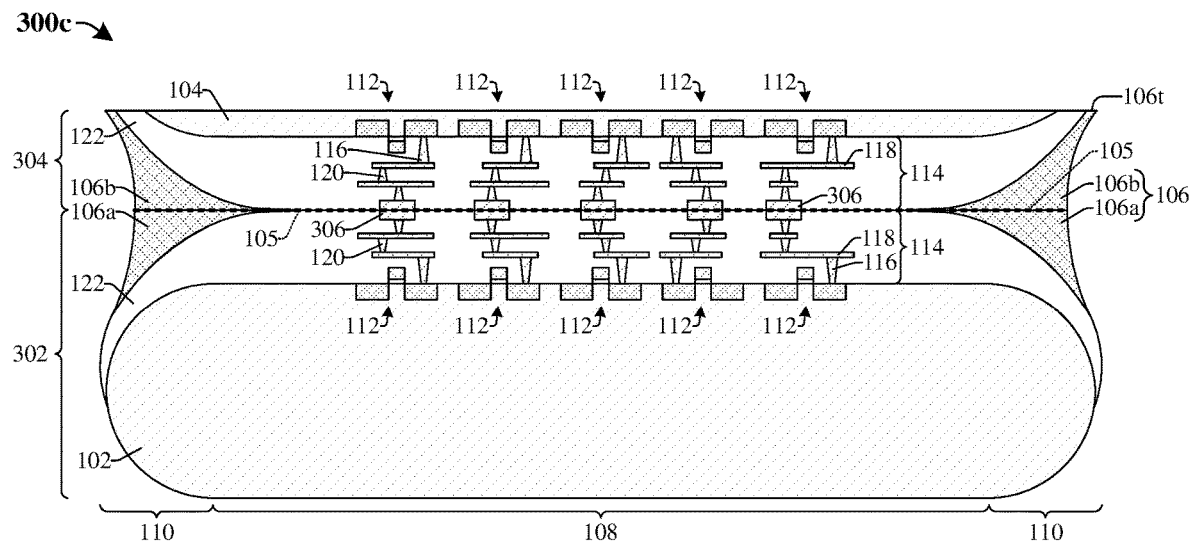

FIG. 3C illustrates a cross-sectional view 300c of some other embodiments of the multi-dimensional integrated chip of FIG. 3A, where the support structure comprises a lower support structure 106a and an upper support structure 106b. In various embodiments, the lower support structure 106a has a top surface aligned with a top surface of the dielectric structure 122 of the first semiconductor structure 302 and the upper support structure 106b has a bottom surface aligned with a bottom surface of the dielectric structure 122 of the second semiconductor structure 304. In some embodiments, the lower support structure 106a meets the upper support structure 106b along the bond interface 105. In further embodiments, support structure 106 comprises dielectric-to-dielectric bond(s) between the lower support structure 106a and the upper support structure 106b or conductor-to-conductor bond(s) between the lower support structure 106a and the upper support structure 106b.

Figure 4:
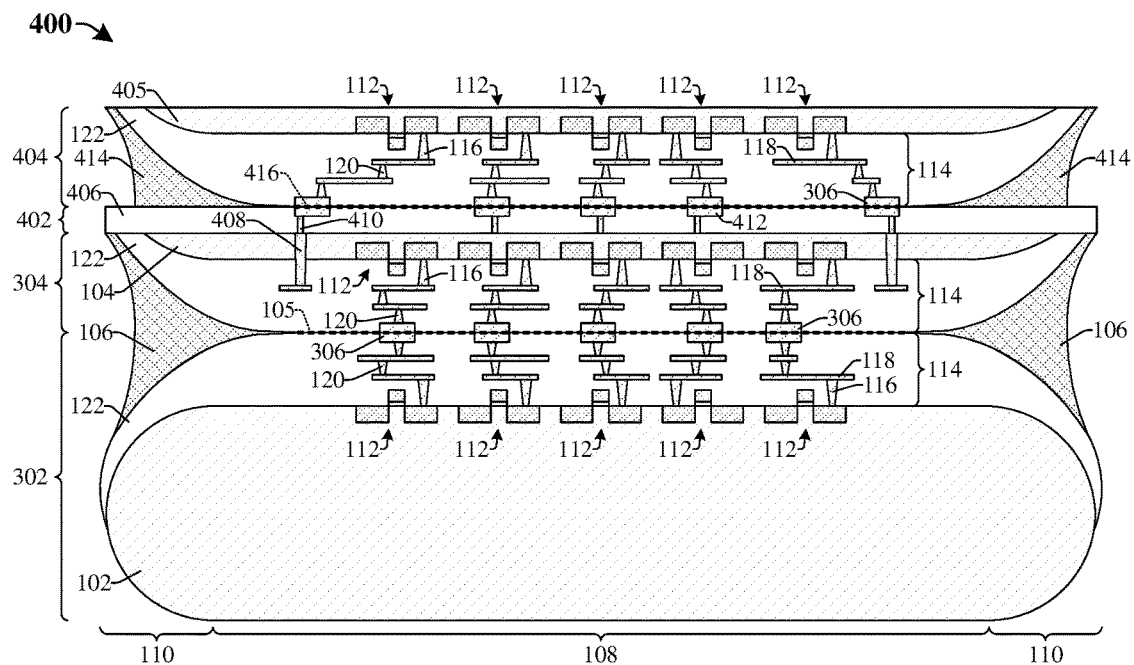
FIG. 4 illustrates a cross-sectional view of other embodiments of a multi-dimensional integrated chip comprising a support structure disposed between a first semiconductor structure and a second semiconductor structure.

FIG. 4 illustrates a cross-sectional view 400 of some alternative embodiments of the multi-dimensional integrated chip of FIG. 3A, in which a third semiconductor structure 404 overlies and is bonded to the second semiconductor structure 304.

An input/output (I/O) structure 402 is disposed over the second semiconductor wafer 104. In some embodiments, the I/O structure 402 comprises a plurality of upper contacts 412 (e.g., contact pads, sold bumps, etc.) that directly overlie a corresponding upper contact via 410 that are disposed within/over an upper dielectric structure 406. The upper contact vias 410 are electrically coupled to an underlying through-substrate via (TSV) 408. The TSVs 408 are disposed within the second semiconductor wafer 104 and are electrically coupled to the semiconductor devices 112 disposed within the first and/or second semiconductor structures 302, 304 by way of the metallization layers within the interconnect structures 114. The I/O structure 402 is configured to provide electrical connections to the first and second semiconductor structures 302, 304.

The third semiconductor structure 404 overlies the second semiconductor structure 304 and meets the I/O structure 402 along an upper bond interface 416. The third semiconductor structure 404 comprises a plurality of semiconductor devices 112 disposed within/on a third semiconductor wafer 405. An interconnect structure 114 comprises metallization layers disposed on the third semiconductor wafer 405. The metallization layers of the interconnect structure 114 are disposed within a dielectric structure 122. An upper support structure 414 is disposed between a curved outer surface of the dielectric structure 122 and the I/O structure 402. The upper support structure 414 fills non-bond areas between the third semiconductor structure 404 and the I/O structure 402 and/or the second semiconductor structure 304, thereby improving structural integrity of the multi-dimensional integrated chip. In some embodiments, the upper support structure 414 may, for example, comprise an oxide (e.g., silicon dioxide), silicon nitride, silicon, amorphous silicon, tungsten, copper, epoxy, a polymer, some other suitable material, or any combination of the foregoing.

FIGS. 5-10 illustrate cross-sectional views 500-1000 of some embodiments of a method for forming a bonded wafer structure comprising a first semiconductor wafer bonded to a second semiconductor wafer and a support structure disposed in a peripheral region of the first semiconductor wafer according to the present disclosure. Although the cross-sectional views 500-1000 shown in FIGS. 5-10 are described with reference to a method, it will be appreciated that the structures shown in FIGS. 5-10 are not limited to the method but rather may stand alone separate of the method. Further, although FIGS. 5-10 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
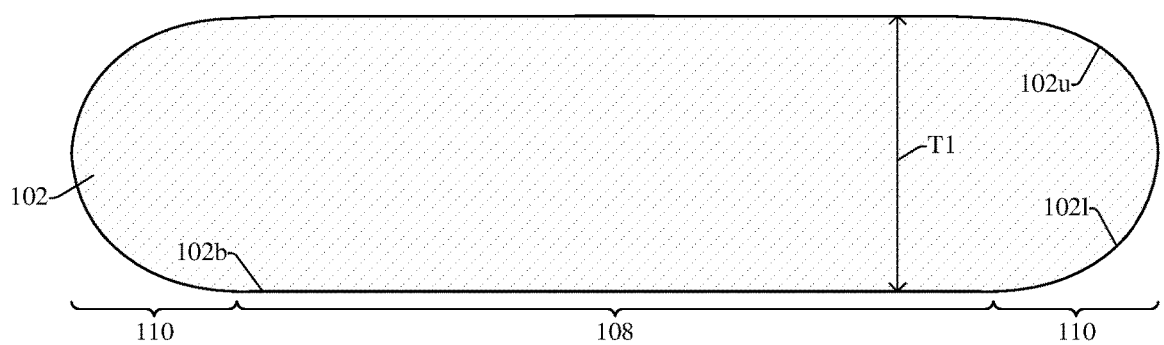
FIGS. 5-10 illustrate cross-sectional views of some embodiments of a method for forming a bonded wafer structure comprising a first semiconductor wafer bonded to a second semiconductor wafer and a support structure disposed in a peripheral region of the first semiconductor wafer.

As shown in cross-sectional view 500 of FIG. 5, a first semiconductor wafer 102 is provided and comprises a central region 108 that is laterally surrounded by a peripheral region 110. In some embodiments, the first semiconductor wafer 102 has an upper rounded edge 102u in the peripheral region 110 and a lower rounded edge 102l below the upper rounded edge 102u. In various embodiments, a first thickness T1 of the first semiconductor wafer 102 is about 775 um, within a range of about 760 um to about 790 um, or another suitable value.

Figure 6:
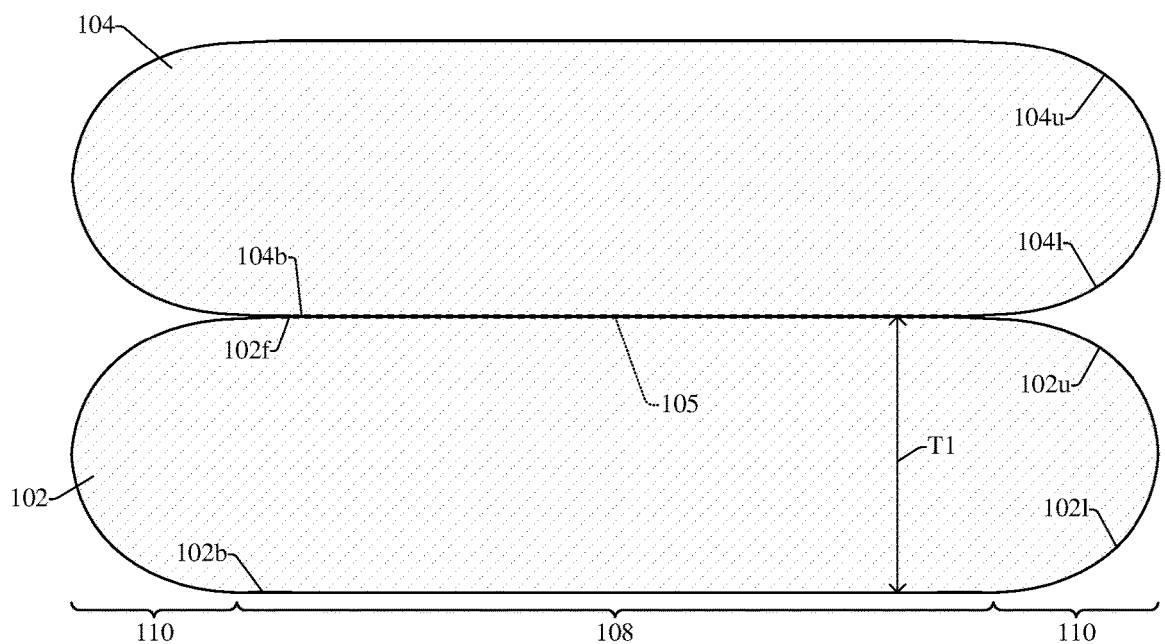

As shown in cross-sectional view 600 of FIG. 6, a bonding process is performed to bond a second semiconductor wafer 104 to the first semiconductor wafer 102. In some embodiment, the bonding process includes bonding a front-side surface 102f of the first semiconductor wafer 102 to a back-side surface 104b of the second semiconductor wafer 104, thereby forming a bond interface 105 between the first and second semiconductor wafers 102, 104. In various embodiments, the bonding process includes performing a direct bonding process, a fusion bonding process, a hybrid bonding process, or another suitable bonding process. Further, after the bonding process one or more non-bond areas may be formed/defined between the first and second semiconductor wafers 102, 104 in the peripheral region 110 and/or in at least a portion of the central region 108.

Figure 7:
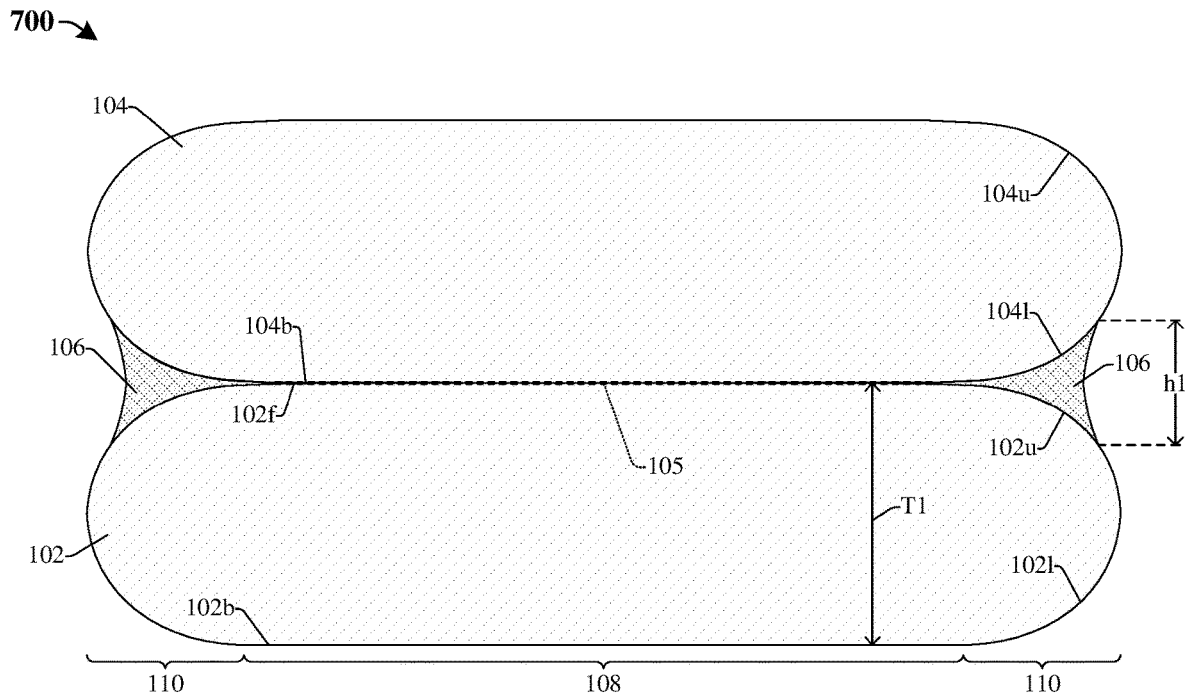

As shown in cross-sectional view 700 of FIG. 7, a support structure 106 is formed in the peripheral region 110 between the upper rounded edge 102u of the first semiconductor wafer 102 and a lower rounded edge 104l of the second semiconductor wafer 104. In various embodiments, the support structure 106 continuously extends from the upper rounded edge 102u of the first semiconductor wafer 102 into the central region 108 and/or directly contacts the bond interface 105. In some embodiments, the support structure 106 may continuously extend from a first point of the first semiconductor wafer 102 to a second point of the first semiconductor wafer 102, where the first point is located at a position about 148 mm from a center of the first semiconductor wafer 102 and the second point is located at a position about 149.8 mm from the center of the first semiconductor wafer 102. In further embodiments, the support structure 106 is laterally offset from and/or does not exist along an outermost edge (e.g., outermost 0.1 mm, outermost 0.15 mm, outermost 0.2 mm, etc.) of the first semiconductor wafer 102 and/or the second semiconductor wafer 104. In yet further embodiments, the support structure 106 continuously extends over a region(s) defined between an outermost 2 mm to an outermost 0.2 mm of the first semiconductor wafer 102 and/or the second semiconductor wafer 104. In various embodiments, the support structure 106 has a height hl that is, for example, within a range of about 0.1 mm to about 0.65 mm, or some other suitable value. Further, the support structure 106 at least partially fills the non-bond areas, thereby improving structural support between the first and second semiconductor wafers 102, 104. The improved structural support reduces damage (e.g., due to unwanted mechanical stress) during subsequent processing steps (e.g., the thinning process of FIG. 8 and/or fabrication steps of FIGS. 9 and 10) performed on the bonded wafer structure.

In some embodiments, a process for forming the support structure 106 includes: performing a deposition process, such as spraying, syringe dispensing, ink-jet printing, injection, coating, etc., to deposit a support material in the outer region between the first and second semiconductor wafers 102, 104; and performing a curing process on the support material. In such embodiments, the support material may be deposited as a liquid and the curing process hardens the liquid of the support material to a solid material. In various embodiments, the support material may, for example, be or comprise epoxy, a polymer, silicon, some other suitable material, or any combination of the foregoing. By depositing the support material as a liquid, the support material may more easily fill gaps between the first and second semiconductor wafers 102, 104 (i.e., more easily fill the non-bond areas). The curing process hardens the support material to facilitate the increased structural support between the first and second semiconductor wafers 102, 104. In further embodiments, during deposition the support material has a viscosity in the range from about 5 Pa·s to about 15 Pa·s or some other suitable value. In yet further embodiments, the curing process reaches a temperature within a range of about 200 to 420 degrees Celsius, or some other suitable value.

In further embodiments, a process for forming the support structure 106 includes: performing a deposition process, such as chemical vapor deposition (CVD), physical vapor deposition (PVD), electro-chemical plating (ECP), or some other suitable deposition or growth process to deposit a support material in the outer region between the first and second semiconductor wafers 102, 104. In various embodiments, the support material may, for example, be or comprise an oxide (e.g., silicon dioxide), silicon nitride, silicon, amorphous silicon, tungsten, copper, some other suitable material, or any combination of the foregoing.

Figure 8:

As shown in cross-sectional view 800 of FIG. 8, a thinning process is performed on the second semiconductor wafer 104. In various embodiments, the thinning process reduces an initial thickness (e.g., of about 775 mm) of the second semiconductor wafer 104 to a second thickness T2. In some embodiments, the second thickness T2 of the second semiconductor wafer 104 is about 3.2 um, within a range of about 3 um to about 3.4 um, or some other suitable value. In further embodiments, the thinning process may include performing a mechanical grinding process, a chemical mechanic planarization (CMP) process, some other suitable thinning process, or any combination of the foregoing. In yet further embodiments, the thinning process may be performed solely by a mechanical grinding process. Further, the thinning process may be performed such that a top surface 106t of the support structure 106 is co-planar with a front-side surface 104f of the second semiconductor wafer 104. By virtue of the support structure 106 being disposed between the first and second semiconductor wafers 102, 104, damage to the bonded wafer structure, such as peeling, cracking, etc. is mitigated, thereby increasing a reliability of the bonded wafer structure.

Figure 9:
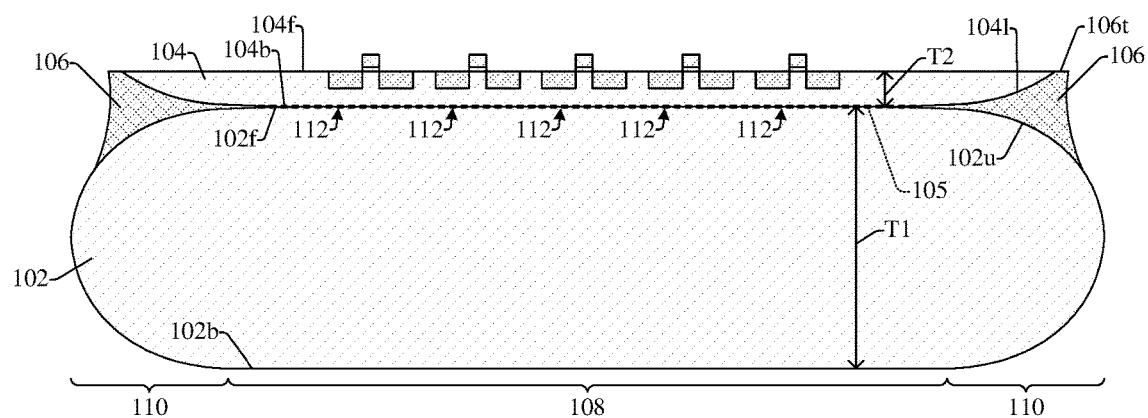

As shown in cross-sectional view 900 of FIG. 9, a plurality of semiconductor devices 112 is formed on and/or within the front-side surface 104f of the second semiconductor wafer 104. In some embodiments, the semiconductor devices 112 may comprise transistors formed by depositing a gate dielectric layer and a gate electrode layer over the second semiconductor wafer 104 and subsequently patterning the gate dielectric layer and gate electrode layer to form a gate dielectric and a gate electrode. Further, an implantation process may be performed on the second semiconductor wafer 104 to form a pair of source/drain regions within the second semiconductor wafer 104 and on opposing sides of the gate electrode.

Figure 10:
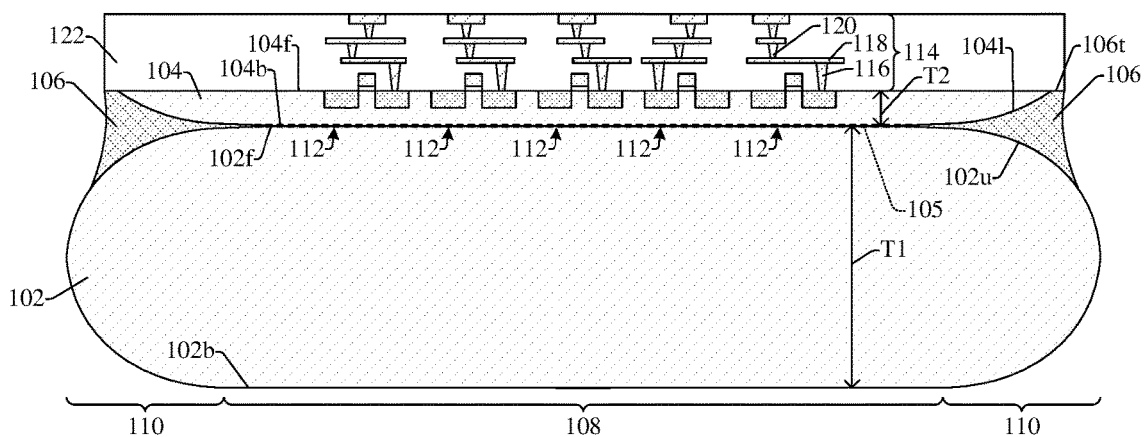

As shown in cross-sectional view 1000 of FIG. 10, an interconnect structure 114 and a dielectric structure 122 are formed over the second semiconductor wafer 104. The interconnect structure 114 comprises metallization layers that include a plurality of conductive contacts 116, a plurality of conductive wires 118, and a plurality of conductive vias 120. The dielectric structure 122 may be formed by one or more deposition process(es) such as a PVD process, a CVD process, an atomic layer deposition (ALD) process, some other suitable growth or deposition process, or any combination of the foregoing. In further embodiments, the metallization layers may be formed by one or more deposition process(es), one or more patterning process(es), one or more planarization process(es), some other suitable fabrication process(es), or any combination of the foregoing.

In yet further embodiments, due to the structural support provided by the support structure 106 in the peripheral region 110, a trimming process utilized to remove materials from the peripheral region 110 may be omitted. Thus, in some embodiments, the bonded wafer structure may be formed without performing a trimming process. Additional wafers may be stacked on and/or bonded to the second semiconductor wafer 104, where trimming process(es) is/are omitted after bonding each addition wafer. As a result, a lateral area for semiconductor devices (e.g., the semiconductor devices 112) in the central region 108 is increased, thereby increasing a device density of the bonded wafer structure and decreasing time/costs associated with fabricating the bonded wafer structure.

Figure 11:
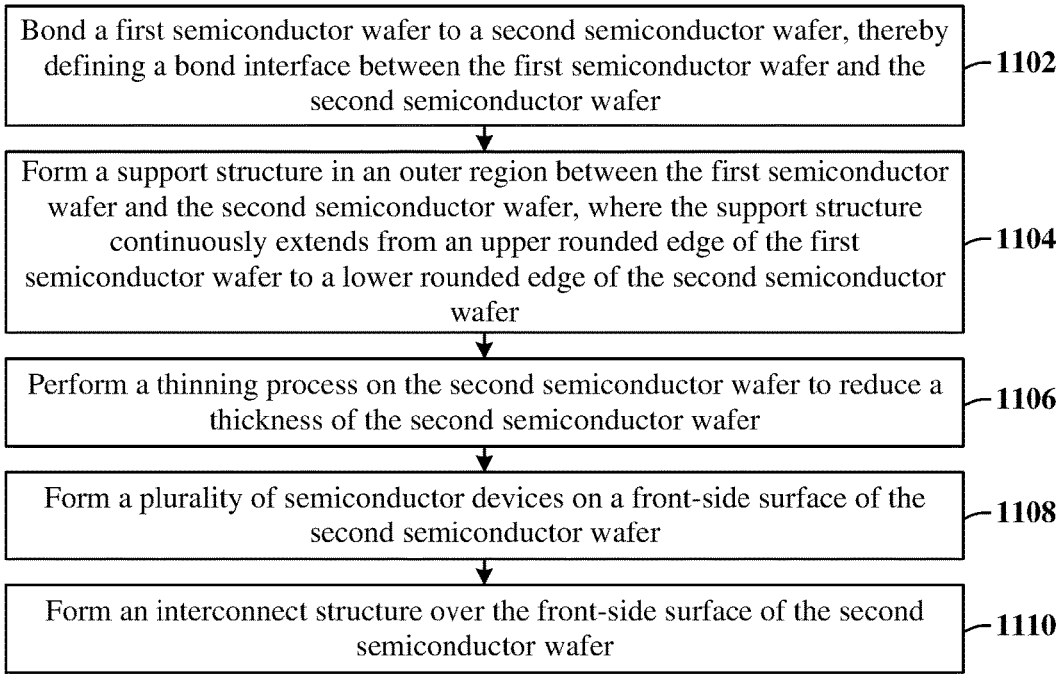
FIG. 11 illustrates a flow diagram of some embodiments of a method of forming a bonded wafer structure comprising a first semiconductor wafer bonded to a second semiconductor wafer and a support structure disposed in a peripheral region of the first semiconductor wafer.

FIG. 11 illustrates a method 1100 of forming a bonded wafer structure comprising a first semiconductor wafer bonded to a second semiconductor wafer and a support structure disposed in a peripheral region of the first semiconductor wafer according to the present disclosure. Although the method 1100 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1102, a first semiconductor wafer is bonded to a second semiconductor wafer, thereby defining a bond interface between the first semiconductor wafer and the second semiconductor wafer. FIG. 6 illustrates a cross-sectional view 600 corresponding to some embodiments of act 1102.

At act 1104, a support structure is formed in an outer region between the first semiconductor wafer and the second semiconductor wafer. The support structure continuously extends from an upper rounded edge of the first semiconductor wafer to a lower rounded edge of the second semiconductor wafer. FIG. 7 illustrates a cross-sectional view 700 corresponding to some embodiments of act 1104.

At act 1106, a thinning process is performed on the second semiconductor wafer to reduce a thickness of the second semiconductor wafer. FIG. 8 illustrates a cross-sectional view 800 corresponding to some embodiments of act 1106.

At act 1108, a plurality of semiconductor devices is formed on a front-side surface of the second semiconductor wafer. FIG. 9 illustrates a cross-sectional view 900 corresponding to some embodiments of act 1108.

At act 1110, an interconnect structure is formed over the front-side surface of the second semiconductor wafer. FIG. 10 illustrates a cross-sectional view 1000 corresponding to some embodiments of act 1110.

FIGS. 12-20 illustrate cross-sectional views 1200-2000 of some embodiments of a method for forming a multi-dimensional integrated chip comprising support structures disposed between bonded semiconductor wafers according to the present disclosure. Although the cross-sectional views 1200-2000 shown in FIGS. 12-20 are described with reference to a method, it will be appreciated that the structures shown in FIGS. 12-20 are not limited to the method but rather may stand alone separate of the method. Further, although FIGS. 12-20 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 12:
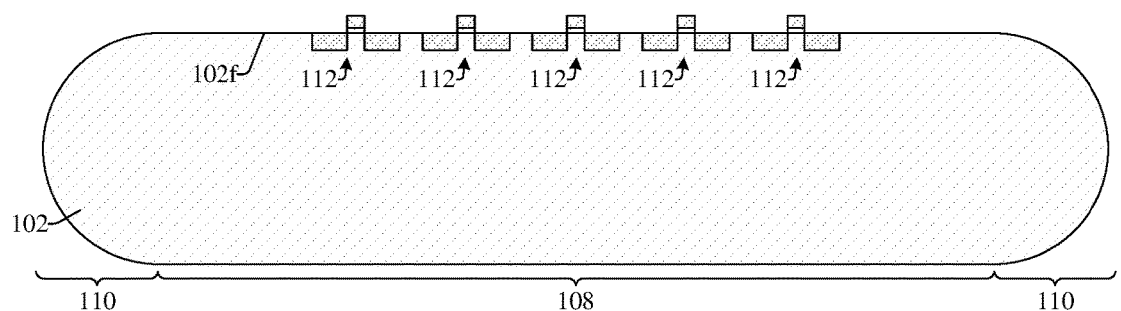
FIGS. 12-20 illustrate cross-sectional views of some embodiments of a method for forming a multi-dimensional integrated chip comprising support structures disposed between bonded semiconductor wafers.

As shown in cross-sectional view 1200 of FIG. 12, a plurality of semiconductor devices 112 is formed on and/or within a front-side surface 102f of a first semiconductor wafer 102. In some embodiments, the semiconductor devices 112 may comprise transistors formed by depositing a gate dielectric layer and a gate electrode layer over the first semiconductor wafer 102 and subsequently patterning the gate dielectric layer and gate electrode layer to form a gate dielectric and a gate electrode. Further, an implantation process may be performed on the first semiconductor wafer 102 to form a pair of source/drain regions within the first semiconductor wafer 102 and on opposing sides of the gate electrode. Further, the first semiconductor wafer 102 comprises a central region 108 that is laterally surrounded by a peripheral region 110, where the semiconductor devices 112 are disposed laterally in the central region 108.

Figure 13:
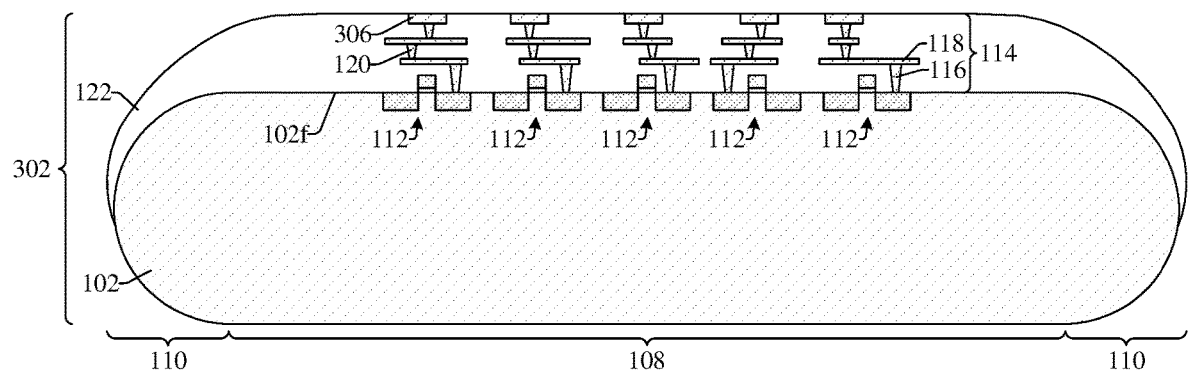

As shown in cross-sectional view 1300 of FIG. 13, an interconnect structure 114 and a dielectric structure 122 are formed on the front-side surface 102f of the first semiconductor wafer 102, thereby defining a first semiconductor structure 302. The interconnect structure 114 comprises metallization layers that include a plurality of conductive contacts 116, a plurality of conductive wires 118, a plurality of conductive vias 120, and a plurality of conductive bonding structures 306. The dielectric structure 122 may be formed by one or more deposition process(es) such as a PVD process, a CVD process, an ALD process, some other suitable growth or deposition process, or any combination of the foregoing. In further embodiments, the metallization layers may be formed by one or more deposition process(es), one or more patterning process(es), one or more planarization process(es), some other suitable fabrication process(es), or any combination of the foregoing.

Figure 14:
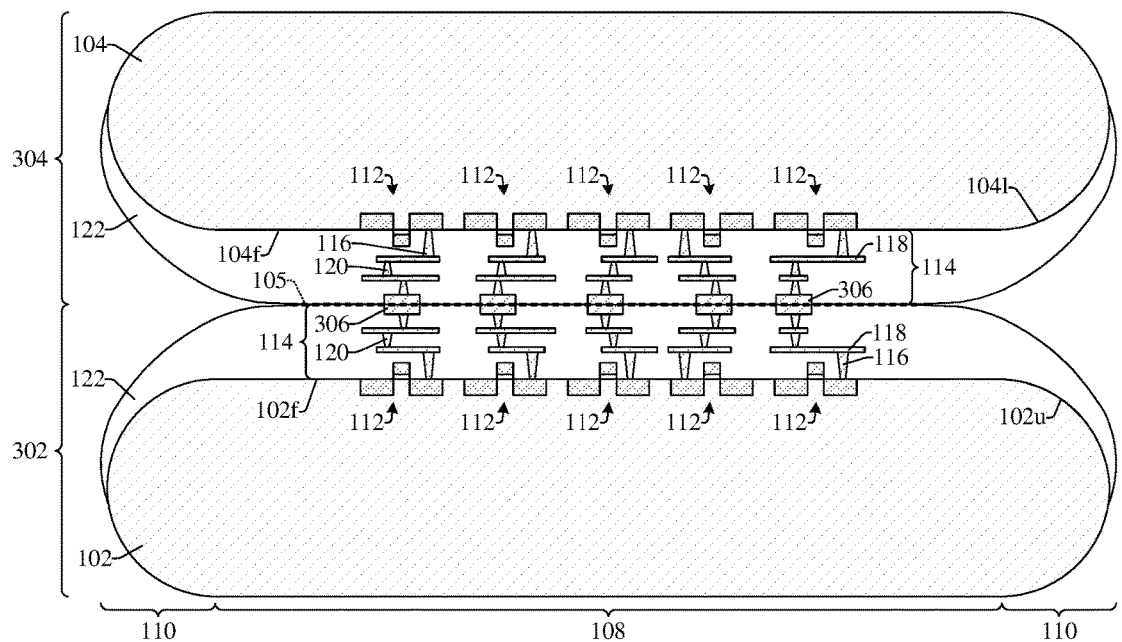

As shown in cross-sectional view 1400 of FIG. 14, a bonding process is performed to bond a second semiconductor structure 304 to the first semiconductor structure 302, thereby forming a bond interface 105 between the first and second semiconductor structures 302, 304. In some embodiments, the second semiconductor structure 304 is formed as illustrated and/or described in FIGS. 12 and 13. In various embodiments, the second semiconductor structure 304 is bonded to the first semiconductor structure 302 by a fusion bonding process, a eutectic bonding process, a hybrid bonding process, or some other suitable bonding process. Further, after the bonding process one or more non-bond areas may be formed/defined between the first and second semiconductor structures 302, 304 in the peripheral region 110 and/or in at least a portion of the central region 108.

Figure 15:
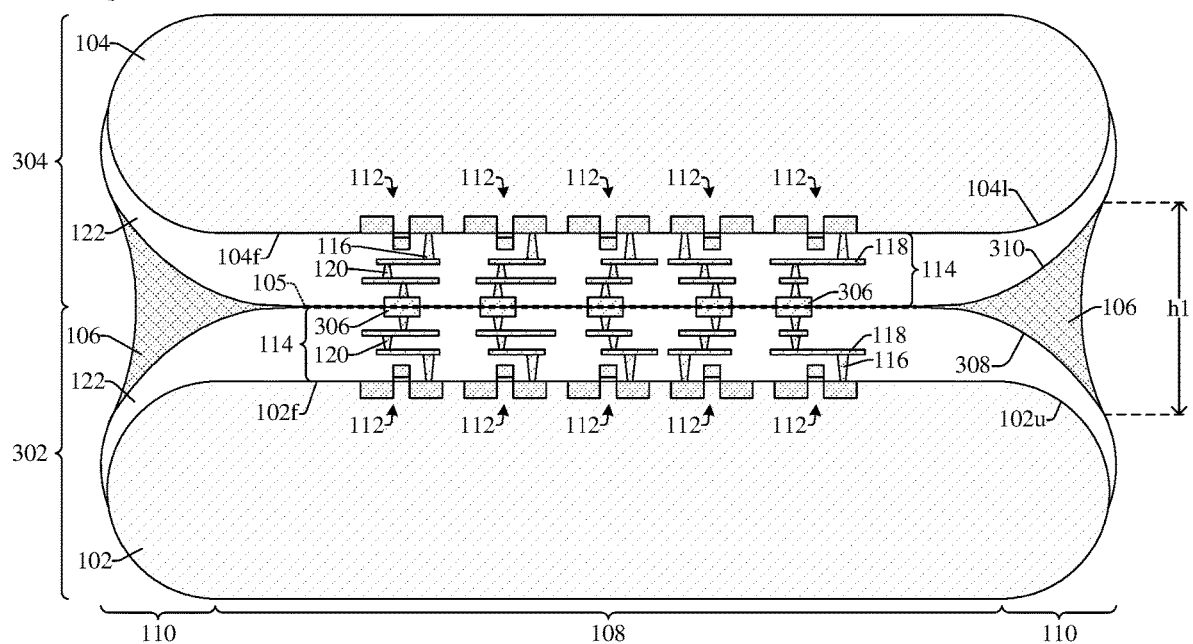

As shown in cross-sectional view 1500 of FIG. 15, a support structure 106 is formed in the peripheral region 110 between a first curved surface 308 of the first semiconductor structure 302 and a second curved surface 310 of the second semiconductor structure 304. In various embodiments, the support structure 106 has a height hl that is, for example, within a range of about 0.1 mm to about 0.65 mm, or some other suitable value. Further, the support structure 106 at least partially fills the non-bond areas, thereby improving structural support between the first and second semiconductor structures 302, 304. The improved structural support reduces damage (e.g., due to unwanted mechanical stress) during subsequent processing steps (e.g., the thinning process of FIG. 16 and/or fabrication steps of FIGS. 17-20) performed on the multi-dimensional integrated chip.

In various embodiments, the support structure 106 continuously extends from over the upper rounded edge $102u$ of the first semiconductor wafer 102 into the central region 108 and/or directly contacts the bond interface 105. In some embodiments, the support structure 106 may continuously extend from over a first point of the first semiconductor wafer 102 to over a second point of the first semiconductor wafer 102, where the first point is located at a position about 148 mm from a center of the first semiconductor wafer 102 and the second point is located at a position about 149.8 mm from the center of the first semiconductor wafer 102. In further embodiments, the support structure 106 is laterally offset from and/or does not exist along the outermost 0.2 mm of the first semiconductor wafer 102 and/or the second semiconductor wafer 104. In yet further embodiments, the support structure 106 continuously extends over a region(s) defined between an outermost 2 mm to an outermost 0.2 mm of the first semiconductor wafer 102 and/or the second semiconductor wafer 104.

In some embodiments, a process for forming the support structure 106 includes: performing a deposition process, such as spraying, syringe dispensing, ink-jet printing, injection, coating, etc., to deposit a support material in the outer region between the first and second semiconductor wafers 102, 104; and performing a curing process on the support material. In such embodiments, the support material may be deposited as a liquid and the curing process hardens the liquid of the support material to a solid material. In various embodiments, the support material may, for example, be or comprise epoxy, a polymer, silicon, some other suitable material(s), or any combination of the foregoing. By depositing the support material as a liquid, the support material may more easily fill gaps between the first and second semiconductor structures 302, 304 (i.e., more easily fill the non-bond areas). The curing process hardens the support material to facilitate the increased structural support between the first and second semiconductor structures 302, 304. In further embodiments, during deposition the support material has a viscosity in the range from about 5 Pa·s to about 15 Pa·s or some other suitable value. In yet further embodiments, the curing process reaches a temperature within a range of about 200 to 420 degrees Celsius, or some other suitable value.

In further embodiments, a process for forming the support structure 106 includes: performing a deposition process, such as CVD, PVD, ECP, or some other suitable deposition or growth process to deposit a support material in the outer region between the first and second semiconductor structures 302, 304. In various embodiments, the support material may, for example, be or comprise an oxide (e.g., silicon dioxide), silicon nitride, silicon, amorphous silicon, tungsten, copper, some other suitable material, or any combination of the foregoing.

Figure 16:
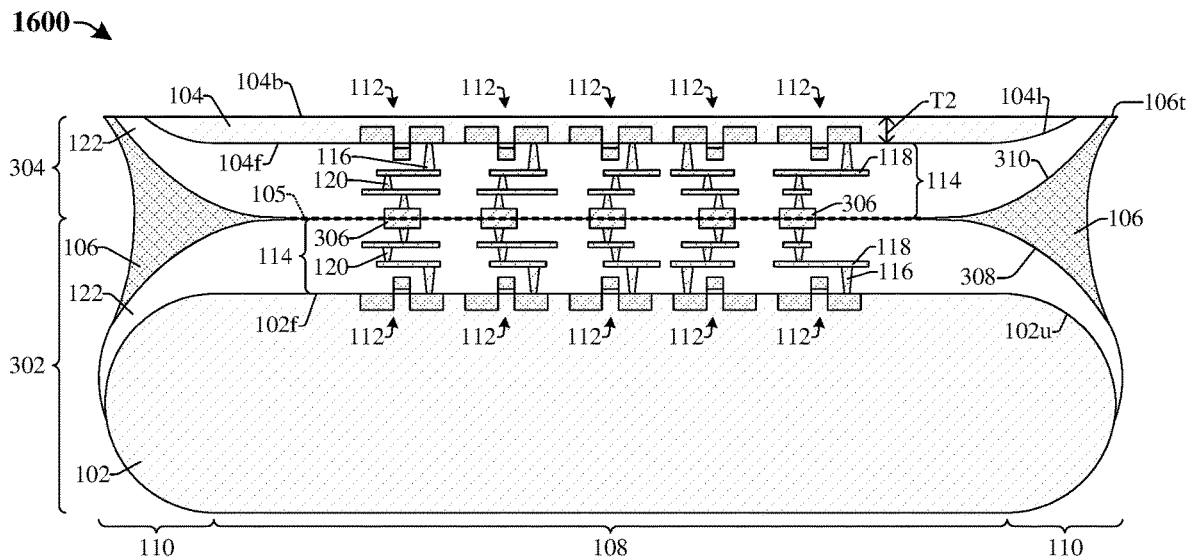

As shown in cross-section view 1600 of FIG. 16, a thinning process is performed on the second semiconductor structure 304. In various embodiments, the thinning process reduces an initial thickness (e.g., of about 775 mm) of the second semiconductor wafer 104 to a second thickness T2. In some embodiments, the second thickness T2 of the second semiconductor wafer 104 is about 3.2 um, within a range of about 3 um to about 3.4 um, or some other suitable value. In further embodiments, the thinning process may include performing a mechanical grinding process, a CMP process, some other suitable thinning process, or any combination of the foregoing. In yet further embodiments, the thinning process may be performed solely by a mechanical grinding process. Further, the thinning process may be performed such that a top surface 106*t* of the support structure 106 is co-planar with a back-side surface 104*b* of the second semiconductor wafer 104. By virtue of the support structure 106 being disposed between the first and second semiconductor structures 302, 304, damage to the multi-dimensional integrated chip (e.g., peeling, cracking, etc.) is mitigated, thereby increasing a reliability of the multi-dimensional integrated chip.

Figure 17:
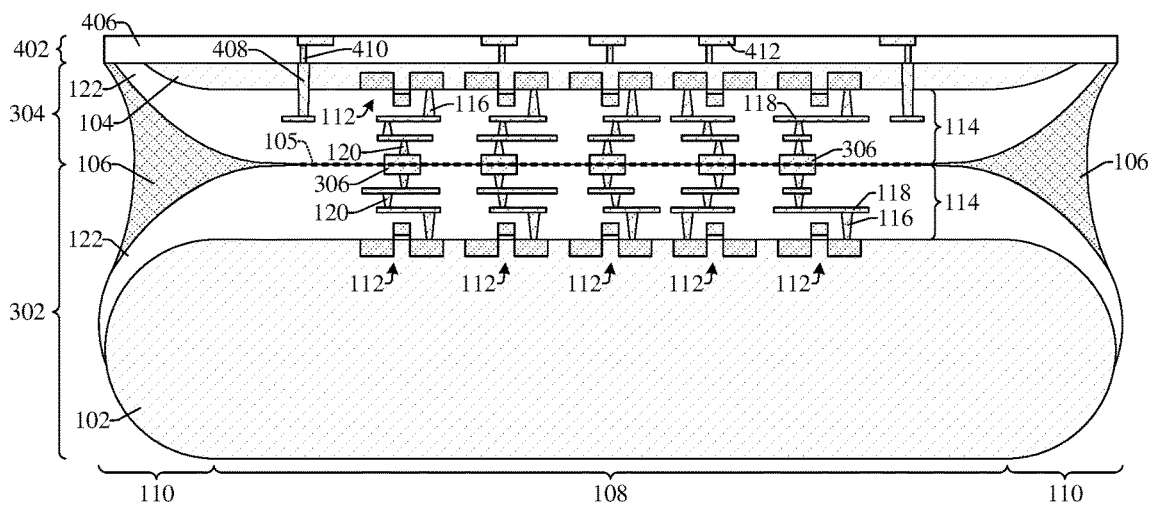

As shown in cross-sectional view 1700 of FIG. 17, an input/output (I/O) structure 402 may be formed over the second semiconductor wafer 104. In various embodiments, before forming the I/O structure 402, a plurality of through-substrate vias (TSVs) 408 may be formed within the second semiconductor wafer 104 and may contact and/or be directly electrically coupled to conductive wires 118 in the interconnect structure 114 of the second semiconductor structure 304. In some embodiments, the I/O structure 402 comprises a plurality of upper contacts 412 and a plurality of upper contact vias 410 that are disposed within/over an upper dielectric structure 406. In some embodiments, the TSVs 408 may, for example, be formed by CVD, PVD, sputtering, electroless plating, ion implantation, another suitable deposition or growth process, or any combination of the foregoing.

In some embodiments, a process for forming the I/O structure 402 includes depositing or growing a dielectric layer over the second semiconductor wafer 104. The dielectric layer may, for example, comprise silicon dioxide, silicon nitride, silicon carbide, silicon oxynitride, silicon oxycarbide, or the like. In further embodiments, the dielectric layer may be deposited or grown by CVD, PVD, ALD, sputtering, thermal oxidation, some other deposition or growth process, or any combination of the foregoing. Thereafter, a plurality of openings (not shown) are formed in the dielectric layer (e.g., via a photobiography process) that extends through the dielectric layer to a corresponding TSV 408. A conductive layer (not shown) is then deposited on the dielectric layer and fills the openings. In some embodiments, the conductive layer may, for example, be or comprise copper, aluminum, tungsten, some other conductive material, or any combination of the foregoing. The conductive layer may be deposited by CVD, PVD, ALD, sputtering, electro plating, electroless plating, some other deposition process, or any combination of the foregoing. Subsequently, a planarization process (e.g., a CMP process) is performed on the conductive layer to form the plurality of contact vias 410, the plurality of upper contacts 412, and the upper dielectric structure 406.

Figure 18:
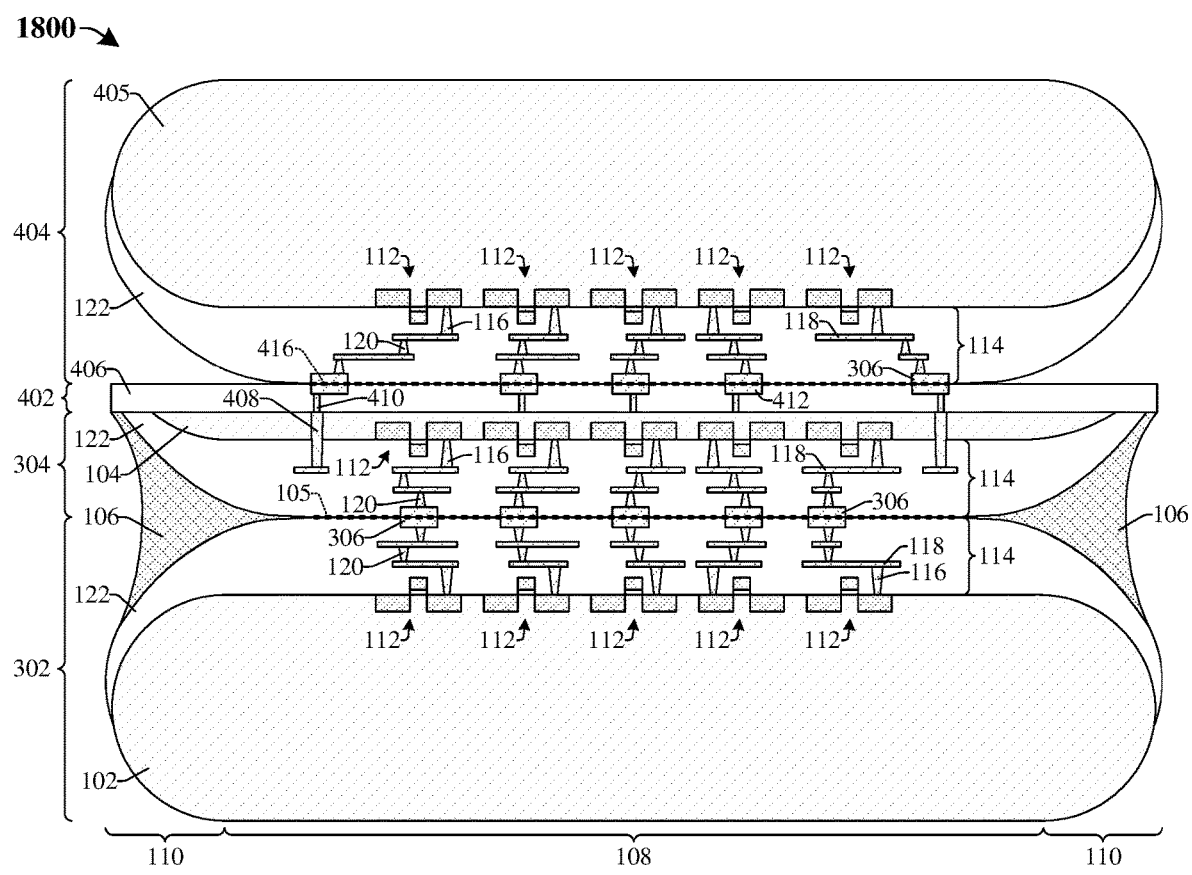

As shown in cross-sectional view 1800 of FIG. 18, a bonding process is performed to bond a third semiconductor structure 404 to the second semiconductor structure 304, thereby forming an upper bond interface 416 between the second and third semiconductor structures 304, 404. In some embodiments, the third semiconductor structure 404 is formed as illustrated and/or described in FIGS. 12 and 13. In various embodiments, the third semiconductor structure 404 is bonded to the second semiconductor structure 304 by a fusion bonding process, a eutectic bonding process, a hybrid bonding process, or some other suitable bonding process.

Figure 19:
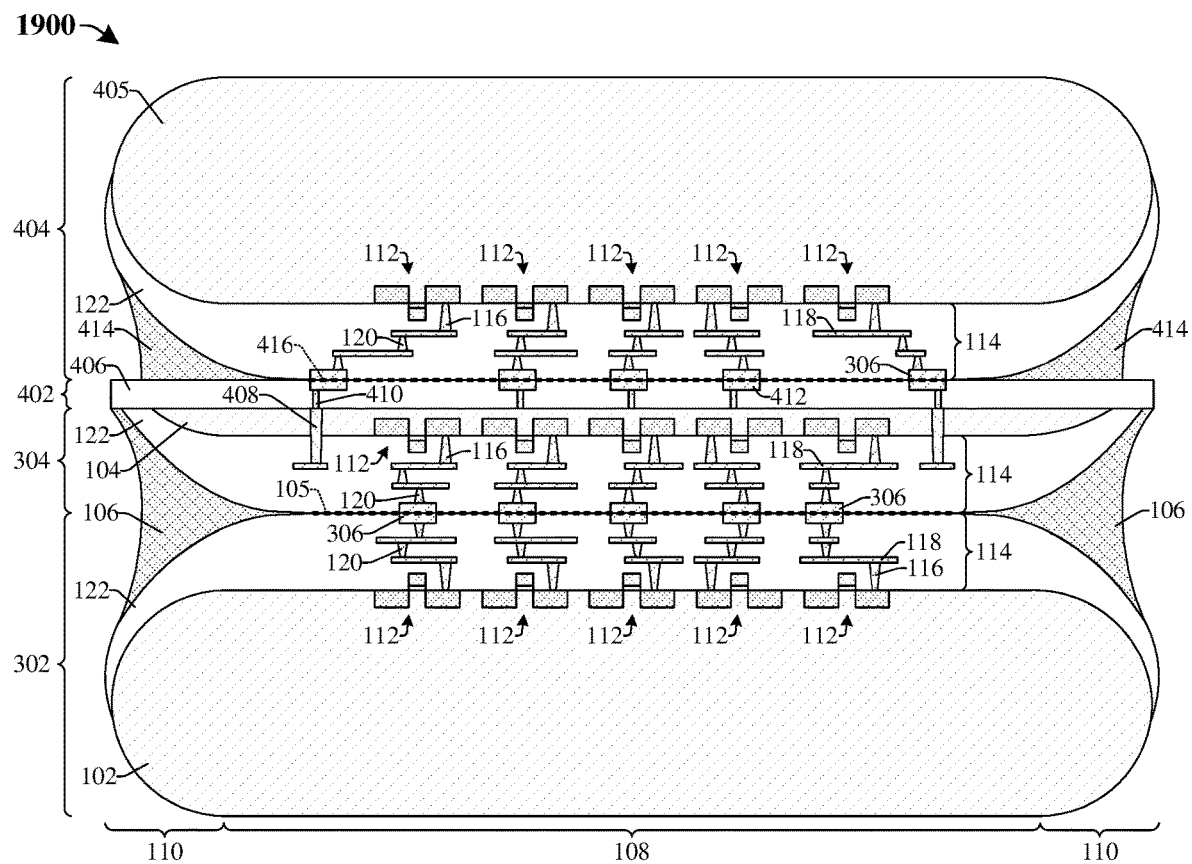

As shown in cross-sectional view 1900 of FIG. 19, an upper support structure 414 is formed in the peripheral region 110 between the third semiconductor structure 404 and the second semiconductor structure 304. In various embodiments, the upper support structure 414 fills one or more non-bond areas between the second semiconductor structure 304 and the third semiconductor structure 404, thereby further improving structural support of the multi-dimensional integrated chip. In various embodiments, the upper support structure 414 may be formed by process(es) substantially similar to or the same as process(es) described above regarding formation of the support structure 106 (e.g., as illustrated and/or described in FIG. 15).

Figure 20:
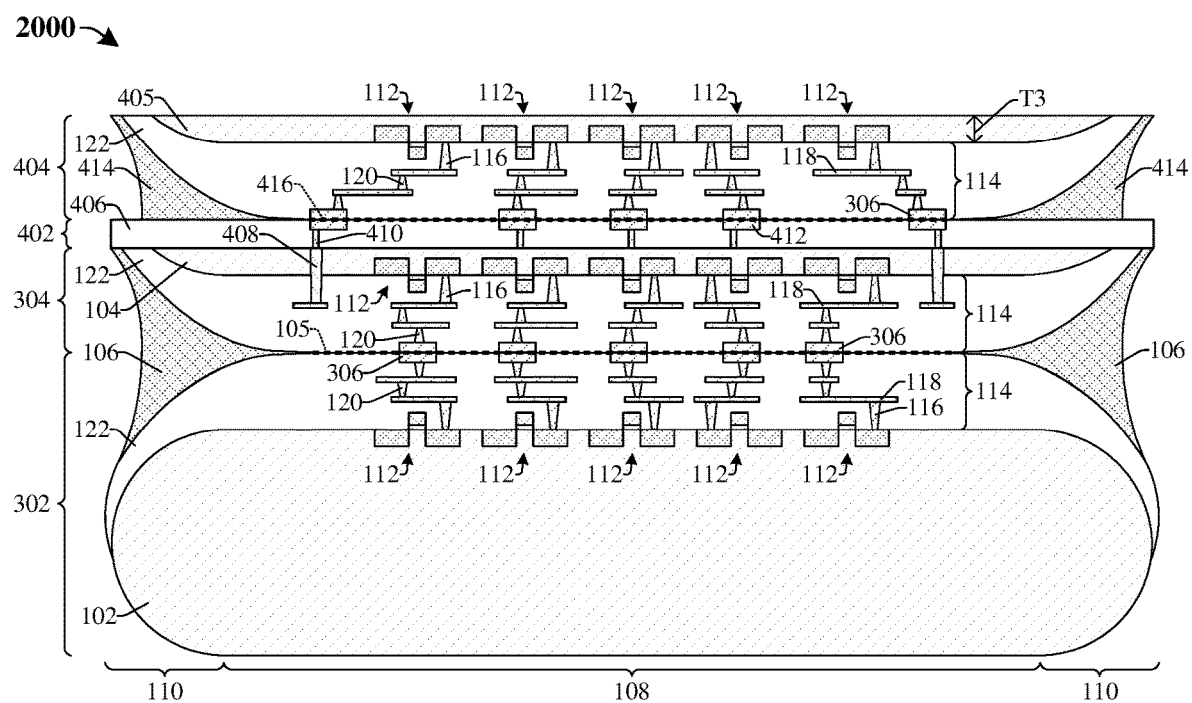

As shown in cross-sectional view 2000 of FIG. 20, a thinning process is performed on the third semiconductor structure 404. In various embodiments, the thinning process reduces an initial thickness (e.g., of about 775 mm) of the third semiconductor wafer 405 to a third thickness T3. In some embodiments, the third thickness T3 of the third semiconductor wafer 405 is about 3.2 um, within a range of about 3 um to about 3.4 um, or some other suitable value. In further embodiments, the thinning process may include performing a mechanical grinding process, a CMP process, some other suitable thinning process, or any combination of the foregoing. In yet further embodiments, the thinning process may be performed solely by a mechanical grinding process. By virtue of the upper support structure 414 being disposed between the second and third semiconductor structures 304, 404, damage to the multi-dimensional integrated chip (e.g., peeling, cracking, etc.) is mitigated, thereby increasing a reliability of the multi-dimensional integrated chip.

In yet further embodiments, due to the structural support provided by the support structure 106 and/or the upper support structure 414, trimming process(es) utilized to remove materials from the peripheral region 110 may be omitted. Thus, in some embodiments, the multi-dimensional integrated chip may be formed without performing a trimming process. For example a trimming process is not performed before and/or after bonding the second semiconductor wafer 104 to the first semiconductor wafer 102 and a trimming process is not performed before and/or after bonding the third semiconductor wafer 405 to the second semiconductor wafer 104. Additional wafers may be stacked on and/or bonded to the third semiconductor wafer 405, where trimming process(es) is/are omitted after bonding each additional semiconductor wafer. As a result, a lateral area for semiconductor devices (e.g., the semiconductor devices 112) in the central region 108 is increased, thereby increasing a device density of the bonded wafer structure and decreasing time/costs associated with fabricating the bonded wafer structure.

Figure 21:
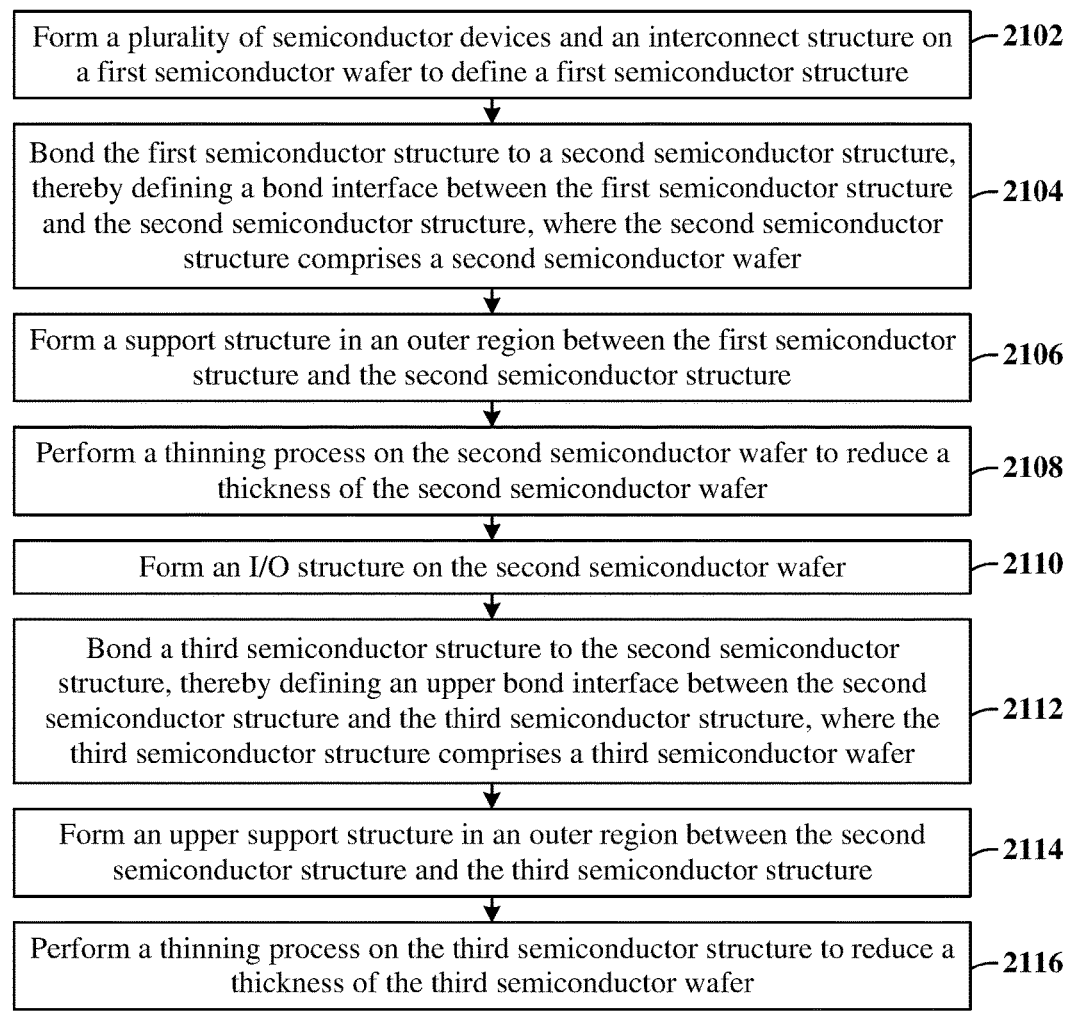
FIG. 21 illustrate a flow diagram of some embodiments of a method of forming a multi-dimensional integrated chip comprising support structures disposed between bonded semiconductor wafers.

FIG. 21 illustrates a method 2100 of forming a multi-dimensional integrated chip comprising support structures disposed between bonded semiconductor wafers according to the present disclosure. Although the method 2100 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2102, a plurality of semiconductor devices and an interconnect structure are formed on a first semiconductor wafer to define a first semiconductor structure. FIGS. 12 and 13 illustrate cross-sectional views 1200 and 1300 corresponding to some embodiments of act 2102.

At act 2104, the first semiconductor structure is bonded to a second semiconductor structure, thereby defining a bond interface between the first semiconductor structure and the second semiconductor structure. The second semiconductor structure comprises a second semiconductor wafer. FIG. 14 illustrates a cross-sectional view 1400 corresponding to some embodiments of act 2104.

At act 2106, a support structure is formed in an outer region between the first semiconductor structure and the second semiconductor structure. FIG. 15 illustrates a cross-sectional view 1500 corresponding to some embodiments of act 2106.

At act 2108, a thinning process is performed on the second semiconductor wafer to reduce a thickness of the second semiconductor wafer. FIG. 16 illustrates a cross-sectional view 1600 corresponding to some embodiments of act 2108.

At act 2110, an I/O structure is formed on the second semiconductor wafer. FIG. 17 illustrates a cross-sectional view 1700 corresponding to some embodiments of act 2110.

At act 2112, a third semiconductor structure is bonded to the second semiconductor structure, thereby defining an upper bond interface between the second semiconductor structure and the third semiconductor structure. The third semiconductor structure comprises a third semiconductor wafer. FIG. 18 illustrates a cross-sectional view 1800 corresponding to some embodiments of act 2112.

At act 2114, an upper support structure is formed in an outer region between the second semiconductor structure and the third semiconductor structure. FIG. 19 illustrates a cross-sectional view 1900 corresponding to some embodiments of act 2114.

At act 2116, a thinning process is performed on the third semiconductor structure to reduce a thickness of the third semiconductor wafer. FIG. 20 illustrates a cross-sectional view 2000 corresponding to some embodiments of act 2116.

Figure 23:
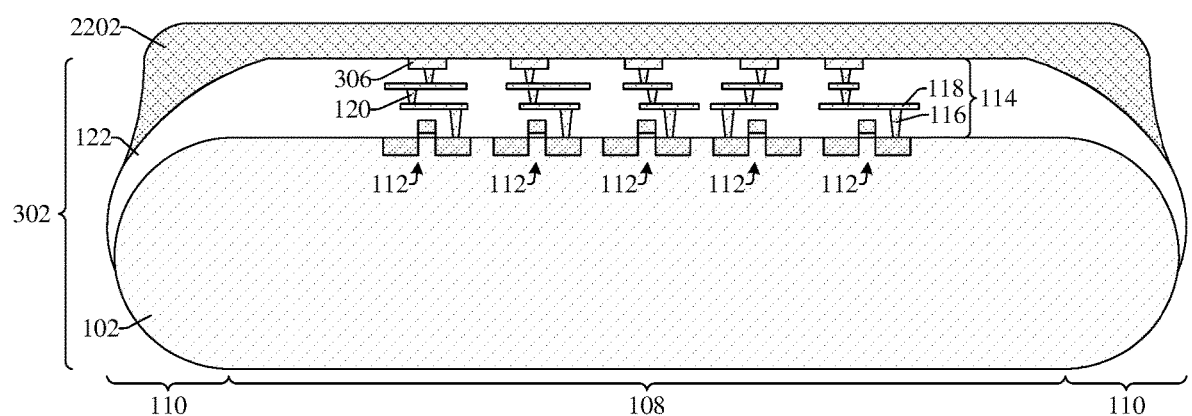
Figure 24:
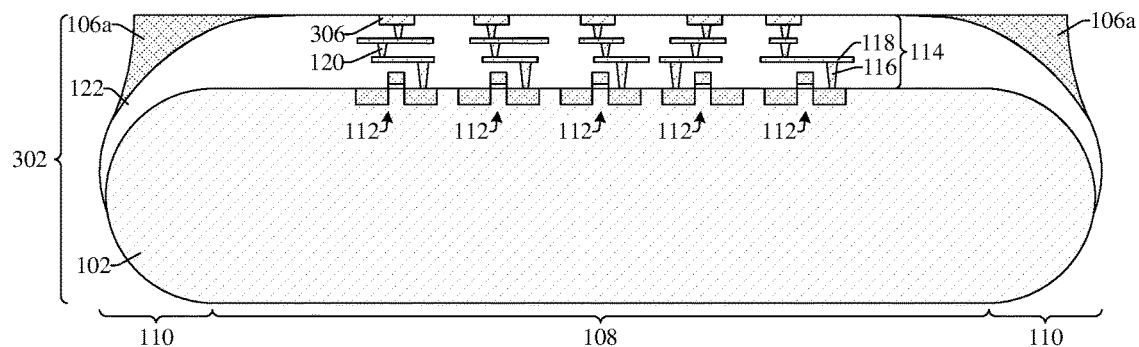
Figure 25:
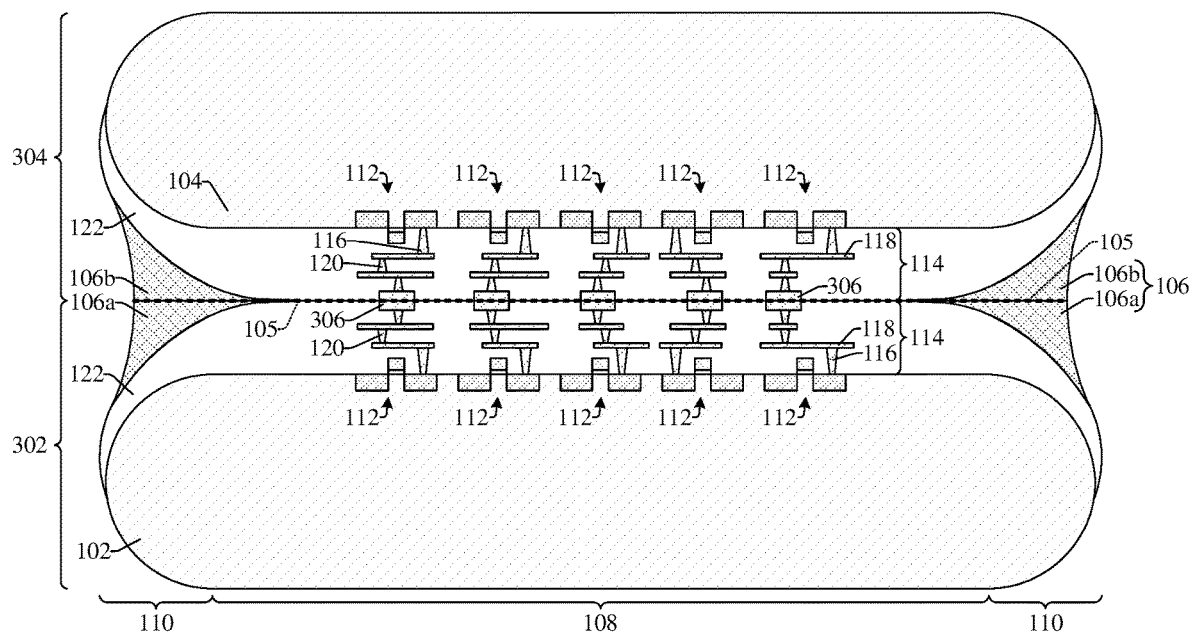

FIGS. 22-25 illustrate cross-sectional views 2200-2500 of some embodiments of acts that may be performed in place of the acts at FIGS. 13-15, such that the method of FIGS. 12-20 may alternatively proceed from FIG. 12 to FIGS. 22-25 and then from FIG. 25 to FIGS. 16-20 (i.e., skipping FIGS. 13-15). Although the cross-sectional views 2200-2500 shown in FIGS. 22-25 are described with reference to a method, it will be appreciated that the structures shown in FIGS. 22-25 are not limited to the method but rather may stand alone separate of the method. Further, although FIGS. 22-25 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 22:
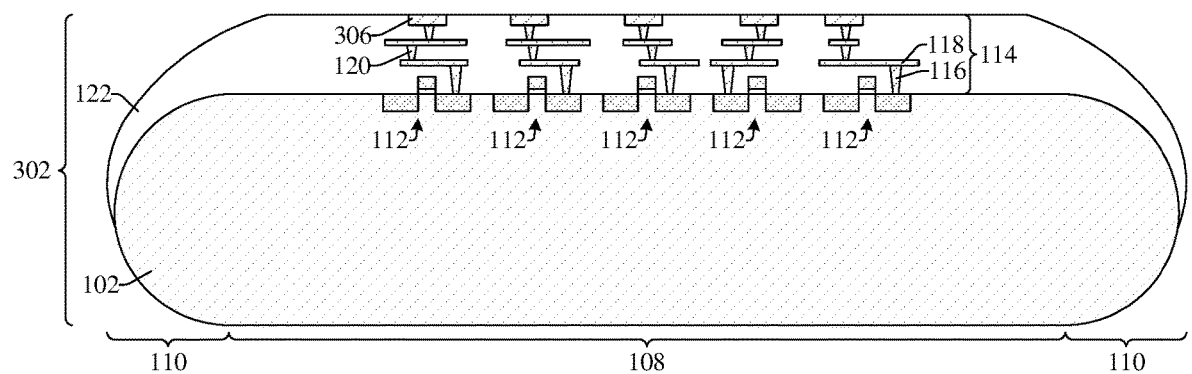
FIGS. 22-25 illustrate cross-sectional views of other embodiments of a method for forming a multi-dimensional integrated chip comprising support structures disposed between bonded semiconductor wafers.

As shown in cross-sectional view 2200 of FIG. 22, a plurality of semiconductor devices 112, an interconnect structure 114, and a dielectric structure 122 are formed on a first semiconductor wafer 102, thereby defining a first semiconductor structure 302. In various embodiments, the semiconductor devices 112, the interconnect structure 114, and the dielectric structure 122 are formed as illustrated and/or described in FIGS. 12-13.

As shown in cross-sectional view 2300 of FIG. 23, a support structure layer 2202 is formed over the interconnect structure 114 and the dielectric structure 122. In some embodiments, a process for forming the support structure layer 2202 includes: performing a deposition process, such as spraying, syringe dispensing, ink-jet printing, injection, coating, etc., to deposit a support material on the first semiconductor structure 302; and performing a curing process on the support material. In such embodiments, the support material may be deposited as a liquid and the curing process hardens the liquid of the support material to a solid material. In various embodiments, the support material may, for example, be or comprise epoxy, a polymer, silicon, some other suitable material(s), or any combination of the foregoing. In further embodiments, during deposition the support material has a viscosity in the range from about 5 Pa·s to about 15·Pa s or some other suitable value. In further embodiments, the curing process reaches a temperature within a range of about 200 to 420 degrees Celsius, or some other suitable value. In further embodiments, a process for forming the support structure layer 2202 includes: performing a deposition process, such as CVD, PVD, ECP, or some other suitable deposition or growth process to deposit a support material on the first semiconductor structure 302. In various embodiments, the support material may, for example, be or comprise an oxide (e.g., silicon dioxide), silicon nitride, silicon, amorphous silicon, tungsten, copper, some other suitable material, or any combination of the foregoing.

As shown in cross-sectional view 2400 of FIG. 24, a planarization process is performed on the support structure layer (2202 of FIG. 23), thereby defining a lower support structure 106a. In various embodiments, the planarization process includes performing a CMP process, an etching process, or the like. In some embodiments, the planarization process is performed such that a top surface of the lower support structure 106a is co-planar with a top surface of the of the dielectric structure 122 and/or a top surface of the interconnect structure 114.

As shown in cross-sectional view 2500 of FIG. 25, a bonding process is performed to bond a second semiconductor structure 304 to the first semiconductor structure 302, thereby forming a bond interface 105 between the first and second semiconductor structures 302, 304 and a support structure 106. In some embodiments, the second semiconductor structure 304 comprises an upper support structure 106b and may be formed as illustrated and/or described in FIGS. 22-24. The support structure 106 comprises the lower support structure 106a and the upper support structure 106b. In various embodiments, the second semiconductor structure 304 is bonded to the first semiconductor structure 302 by a fusion bonding process, a eutectic bonding process, a hybrid bonding process, or some other suitable bonding process. In further embodiments, the lower support structure 106a directly contacts the upper support structure 106b along the bond interface 105.

Accordingly, in some embodiments, the present disclosure relates to an integrated chip comprising a support structure disposed between a curved outer edge of a first semiconductor wafer and a curved outer edge of a second semiconductor wafer.

In some embodiments, the present application provides a method for forming a semiconductor structure, the method includes: bonding a first semiconductor wafer to a second semiconductor wafer, wherein a bond interface is disposed between the first and second semiconductor wafers, wherein the first semiconductor wafer has a peripheral region laterally surrounding a central region; forming a support structure between a first outer edge of the first semiconductor wafer and a second outer edge of the second semiconductor wafer, wherein the support structure is disposed within the peripheral region; and performing a thinning process on the second semiconductor wafer. In an embodiment, a lower surface of the support structure conforms to a rounded shaped of the first outer edge and an upper surface of the support structure conforms to a rounded shape of the second outer edge. In an embodiment, the support structure is deposited as a liquid and a curing process is performed before the thinning process to harden the support structure. In an embodiment, the curing process reaches a temperature within a range of about 200 to 420 degrees Celsius. In an embodiment, the thinning process removes at least a portion of the support structure, wherein a top surface of the support structure is co-planar with a top surface of the second semiconductor wafer. In an embodiment, the support structure is formed after bonding the first semiconductor wafer to the second semiconductor wafer, and wherein the support structure directly contacts at least a portion of the bond interface. In an embodiment, the method further comprises: bonding a third semiconductor wafer to the second semiconductor wafer, wherein an upper bond interface is disposed between the second semiconductor wafer and the third semiconductor wafer; forming an upper support structure between the second outer edge of the second semiconductor wafer and a third outer edge of the third semiconductor wafer; and performing a second thinning process on the third semiconductor wafer. In an embodiment, a trimming process is not performed on the second semiconductor wafer and the third semiconductor wafer.

In some embodiments, the present application provides a method for forming a semiconductor structure, the method includes: forming a first plurality of semiconductor devices over a central region of a first semiconductor wafer; bonding a second semiconductor wafer to the first semiconductor wafer, wherein a bond interface is disposed between the first and second semiconductor wafers, wherein the first semiconductor wafer has a first rounded edge and the second semiconductor wafer has a second rounded edge; forming a support structure between the first rounded edge and the second rounded edge, wherein the support structure is ring-shaped and laterally encloses the central region; and reducing a thickness of the second semiconductor wafer after forming the support structure. In an embodiment, the method further includes: forming a first interconnect structure and a first dielectric structure on the first semiconductor wafer; forming a second plurality of semiconductor devices on the second semiconductor wafer; and forming a second interconnect structure and a second dielectric structure on the second semiconductor wafer, wherein the first dielectric structure contacts the second dielectric structure at the bond interface, wherein the support structure continuously extends from a first rounded edge of the first dielectric structure to a second rounded edge of the second dielectric structure. In an embodiment, the support structure comprises a conductive material different from a dielectric material of the first and second dielectric structures. In an embodiment, a width of the support structure is greater than a width of the second rounded edge of the second dielectric structure. In an embodiment, reducing the thickness of the second semiconductor wafer removes portions of the second dielectric structure and portions of the support structure, wherein a top surface of the second dielectric structure, a top surface of the second dielectric structure, and a top surface of the support structure are co-planar. In an embodiment, forming the support structure includes: forming a lower support structure on the first rounded edge of the first dielectric structure; and forming an upper support structure on the second rounded edge of the second dielectric structure, wherein the lower support structure directly contacts the upper support structure along the bond interface. In an embodiment, the support structure conforms to a shape of a first notch of the first semiconductor wafer, and wherein the support structure is disposed between the first notch of the first semiconductor wafer and a second notch of the second semiconductor wafer. In an embodiment, a width of the support structure continuously increases from the bond interface in a direction away from the central region. In an embodiment, the support structure is formed by chemical vapor deposition, physical vapor deposition, or electro-chemical plating. In an embodiment, reducing the thickness of the second semiconductor wafer reduces a diameter of the second semiconductor wafer, wherein the diameter of the second semiconductor wafer is less than a diameter of the first semiconductor wafer.

In some embodiments, the present application provides a method for forming an integrated chip, the method includes: bonding a first semiconductor wafer to a second semiconductor wafer, wherein the first semiconductor wafer comprises a first rounded edge, wherein the second semiconductor wafer comprises a second rounded edge and a third rounded edge above the second rounded edge, wherein the first rounded edge faces the second rounded edge; forming a support structure between the first semiconductor wafer and the second semiconductor wafer, wherein the support structure continuously vertically extends from the first rounded edge to the second rounded edge, wherein a height of the support structure continuously increases from an interface between the first and second semiconductor wafers in a direction away from a center of the first semiconductor wafer; and performing a thinning process on the second semiconductor wafer, wherein the thinning process removes the third rounded edge of the second semiconductor wafer, and wherein after the thinning process a top surface of the support structure is co-planar with a top surface of the second semiconductor wafer. In an embodiment, the method further includes: forming a plurality of semiconductor devices over a center region of the second semiconductor wafer, wherein the support structure laterally encloses the center region; and wherein the first semiconductor wafer directly contacts the second semiconductor wafer at the interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    bonding a first semiconductor wafer to a second semiconductor wafer, wherein a bond interface is disposed between the first and second semiconductor wafers, wherein the first semiconductor wafer has a peripheral region laterally surrounding a central region;
    forming a support structure between a first outer edge of the first semiconductor wafer and a second outer edge of the second semiconductor wafer, wherein the support structure is disposed within the peripheral region, wherein the support structure comprises an inner segment between the first semiconductor wafer and the second semiconductor wafer, wherein the support structure is laterally offset from an outermost point of the first outer edge by a lateral distance that is greater than a vertical thickness of the inner segment; and
    performing a thinning process on the second semiconductor wafer.

2. The method of claim 1, wherein a lower surface of the support structure conforms to a rounded shape of the first outer edge and an upper surface of the support structure conforms to a rounded shape of the second outer edge.

3. The method of claim 1, wherein the support structure is deposited as a liquid and a curing process is performed before the thinning process to harden the support structure.

4. The method of claim 3, wherein the curing process reaches a temperature within a range of about 200 to 420 degrees Celsius.

5. The method of claim 1, wherein the thinning process removes at least a portion of the support structure, wherein a top surface of the support structure is co-planar with a top surface of the second semiconductor wafer.

6. The method of claim 1, wherein the support structure is formed after bonding the first semiconductor wafer to the second semiconductor wafer, and wherein the support structure directly contacts at least a portion of the bond interface.

7. The method of claim 1, further comprising:
    bonding a third semiconductor wafer to the second semiconductor wafer, wherein an upper bond interface is disposed between the second semiconductor wafer and the third semiconductor wafer;
    forming an upper support structure between the second outer edge of the second semiconductor wafer and a third outer edge of the third semiconductor wafer; and
    performing a second thinning process on the third semiconductor wafer.

8. The method of claim 7, wherein a trimming process is not performed on the second semiconductor wafer and the third semiconductor wafer.

9. A method for forming an integrated chip, comprising:
    forming a first plurality of semiconductor devices over a central region of a first semiconductor wafer;
    bonding a second semiconductor wafer to the first semiconductor wafer, wherein a bond interface is disposed between the first and second semiconductor wafers, wherein the first semiconductor wafer has a first rounded edge and the second semiconductor wafer has a second rounded edge;
    forming a support structure between the first rounded edge and the second rounded edge, wherein the support structure is ring-shaped and laterally encloses the central region, wherein the support structure conforms to a shape of a first notch of the first semiconductor wafer, and wherein the support structure is disposed between the first notch of the first semiconductor wafer and a second notch of the second semiconductor wafer; and
    reducing a thickness of the second semiconductor wafer after forming the support structure.

10. The method of claim 9, further comprising:
    forming a first interconnect structure and a first dielectric structure on the first semiconductor wafer;
    forming a second plurality of semiconductor devices on the second semiconductor wafer; and
    forming a second interconnect structure and a second dielectric structure on the second semiconductor wafer, wherein the first dielectric structure contacts the second dielectric structure at the bond interface, wherein the support structure continuously extends from a first rounded edge of the first dielectric structure to a second rounded edge of the second dielectric structure.

11. The method of claim 10, wherein the support structure comprises a conductive material different from a dielectric material of the first and second dielectric structures.

12. The method of claim 10, wherein a width of the support structure is greater than a width of the second rounded edge of the second dielectric structure.

13. The method of claim 10, wherein reducing the thickness of the second semiconductor wafer removes portions of the second dielectric structure and portions of the support structure, wherein a top surface of the second dielectric structure and a top surface of the support structure are co-planar.

14. The method of claim 10, wherein forming the support structure comprises:
    forming a lower support structure on the first rounded edge of the first dielectric structure; and
    forming an upper support structure on the second rounded edge of the second dielectric structure, wherein the lower support structure directly contacts the upper support structure along the bond interface.

15. The method of claim 9, wherein a width of the support structure continuously increases from the bond interface in a direction away from the central region.

16. The method of claim 9, wherein the support structure is formed by chemical vapor deposition, physical vapor deposition, or electro-chemical plating.

17. The method of claim 9, wherein reducing the thickness of the second semiconductor wafer reduces a diameter of the second semiconductor wafer, wherein the diameter of the second semiconductor wafer is less than a diameter of the first semiconductor wafer.

18. A method for forming an integrated chip, comprising:
    bonding a first semiconductor wafer to a second semiconductor wafer, wherein the first semiconductor wafer comprises a first rounded edge, wherein the second semiconductor wafer comprises a second rounded edge and a third rounded edge above the second rounded edge, wherein the first rounded edge faces the second rounded edge;
    forming a support structure between the first semiconductor wafer and the second semiconductor wafer, wherein the support structure continuously vertically extends from the first rounded edge to the second rounded edge, wherein a height of the support structure continuously increases from an interface between the first and second semiconductor wafers in a first direction away from a center of the first semiconductor wafer, wherein an outer sidewall of the support structure is curved in a second direction towards the interface; and
    performing a thinning process on the second semiconductor wafer, wherein the thinning process removes the third rounded edge of the second semiconductor wafer, and wherein after the thinning process a top surface of the support structure is co-planar with a top surface of the second semiconductor wafer.

19. The method of claim 18, further comprising:

forming a plurality of semiconductor devices over a center region of the second semiconductor wafer, wherein the support structure laterally encloses the center region; and wherein the first semiconductor wafer directly contacts the second semiconductor wafer at the interface.

20. The method of claim 18, wherein the support structure comprises a metal.

* * * * *